(12) United States Patent
Mitani et al.

(10) Patent No.: US 8,309,946 B2
(45) Date of Patent: Nov. 13, 2012

(54) RESISTANCE VARIABLE ELEMENT

(75) Inventors: Satoru Mitani, Osaka (JP); Shunsaku Muraoka, Osaka (JP); Yoshihiko Kanzawa, Osaka (JP); Koji Katayama, Nara (JP); Ryoko Miyanaga, Nara (JP); Satoru Fujii, Osaka (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 79 days.

(21) Appl. No.: 12/935,455

(22) PCT Filed: Jul. 22, 2009

(86) PCT No.: PCT/JP2009/003448
§ 371 (c)(1),
(2), (4) Date: Sep. 29, 2010

(87) PCT Pub. No.: WO2010/086916
PCT Pub. Date: Aug. 5, 2010

(65) Prior Publication Data
US 2011/0031465 A1  Feb. 10, 2011

(30) Foreign Application Priority Data
Jan. 29, 2009 (JP) ................ 2009-017548

(51) Int. Cl.
*H01L 47/00* (2006.01)
(52) U.S. Cl. ... 257/5; 257/2; 257/3; 257/4; 257/E45.003
(58) Field of Classification Search ............ 257/2–5, 257/E45.002, E45.003
See application file for complete search history.

(56) References Cited

U.S. PATENT DOCUMENTS

| 7,157,738 | B2 * | 1/2007 | Sato et al. ............. 257/71 |
| 7,167,387 | B2 * | 1/2007 | Sugita et al. .......... 365/148 |
| 8,013,711 | B2 * | 9/2011 | Wei et al. ............... 338/20 |
| 2004/0245557 | A1 | 12/2004 | Seo et al. |
| 2005/0167699 | A1 | 8/2005 | Sugita et al. |
| 2008/0083918 | A1 | 4/2008 | Aratani et al. |
| 2009/0283736 | A1 | 11/2009 | Kanzawa et al. |
| 2009/0321709 | A1 | 12/2009 | Muraoka et al. |
| 2009/0321711 | A1 | 12/2009 | Takagi et al. |

FOREIGN PATENT DOCUMENTS

| JP | 2004-363604 | 12/2004 |
| JP | 2006-040946 | 2/2006 |
| JP | 2008-198941 | 8/2008 |
| WO | WO 2005/041303 A1 | 5/2005 |
| WO | WO 2008/023637 A1 | 2/2008 |
| WO | WO 2008/047530 A1 | 4/2008 |
| WO | WO 2008/149484 A1 | 12/2008 |

* cited by examiner

*Primary Examiner* — Shouxiang Hu
(74) *Attorney, Agent, or Firm* — McDermott Will & Emery LLP

(57) ABSTRACT

A resistance variable element of the present invention comprises a first electrode (103), a second electrode (107), and a resistance variable layer which is interposed between the first electrode (103) and the second electrode (107) to contact the first electrode (103) and the second electrode (107), the resistance variable layer being configured to change in response to electric signals with different polarities which are applied between the first electrode (103) and the second electrode (107), the resistance variable layer comprising an oxygen-deficient transition metal oxide layer, and the second electrode (107) comprising platinum having minute hillocks (108).

7 Claims, 18 Drawing Sheets

(a)

(b)

Pt/TaOx[400°C]

(a)

Pt/TaOx[100°C]

(b)

RESISTANCE VARIABLE ELEMENT

RELATED APPLICATIONS

This application is the U.S. National Phase under 35 U.S.C. §371 of International Application No. PCT/JP2009/003448, filed on Jul. 22, 2009, which in turn claims the benefit of Japanese Application No. 2009-017548, filed on Jan. 29, 2009, the disclosures of which Applications are incorporated by reference herein.

TECHNICAL FIELD

The present invention relates to a resistance variable element. Particularly, the present invention relates to a resistance changing resistance variable element configured to change resistance values in response to electric signals applied, and a manufacturing method thereof.

BACKGROUND ART

With recent advancement of digital technologies, electronic hardware such as portable information devices and home information appliances have been developed to provide higher functionality. For this reason, demands for an increase in a capacity of a resistance variable element, reduction in a write electric power in the element, reduction in write/read time in the element and a longer life of the element have been increasing.

Under the circumstances in which there are such demands, it is said that there is a limitation on miniaturization of the existing flash memory using a floating gate. On the other hand, a resistance variable element (resistance variable memory) using a resistance variable layer as a material of a memory section is formed by a memory element having a simple structure including a resistance variable element. Therefore, the resistance variable element is expected to achieve further miniaturization, a higher-speed, and lower electric power consumption.

When using the resistance variable layer as the material of the memory section, its resistance value changes from a high-resistance value to a low-resistance value or from the low-resistance value to the high-resistance value, for example, by applying electric pulses thereto. In this case, it is necessary to clearly distinguish two values, which are the high-resistance value and the low-resistance value, to change the resistance value stably between the low-resistance value and the high-resistance value at a high-speed, and to retain these two values in a nonvolatile manner. To achieve stabilization of such memory characteristics and miniaturization of the memory element, a variety of proposals have been made in the past.

As one of such proposals, Patent document 1 discloses a memory element in which a memory cell is formed by a resistance variable element which includes two electrodes and a storing layer sandwiched between these electrodes and is configured to reversibly change resistance values of the storing layer. FIG. 17 is a cross-sectional view showing a configuration of such a conventional memory element.

As shown in FIG. 17, the memory element has a configuration in which a plurality of resistance variable elements 10 constituting memory cells are arranged in an array form. Each resistance variable element 10 has a configuration in which a high-resistance layer 2 and an ion source layer 3 are sandwiched between a lower electrode 1 and an upper electrode 4. The high-resistance layer 2 and the ion source layer 3 form the storing layer. The storing layer enables data to be stored in the resistance variable element 10 in each of the memory cells.

The resistance variable elements 10 are disposed above MOS transistors 18, respectively, formed on a semiconductor substrate 11. Each of the MOS transistor 18 includes source/drain regions 13 formed in a region isolated by an element isolating layer 12 inside the semiconductor substrate 11, and a gate electrode 14. The gate electrode 14 also serves as a word line which is one address wire of the memory element.

One of the source/drain regions 13 of the MOS transistor 18 is electrically connected to the lower electrode 1 of the resistance variable element 10 via a plug layer 15, a metal wire layer 16, and a plug layer 17. The other of the source/drain regions 13 of the MOS transistor 18 is connected to the metal wire layer 16 via the plug layer 15. The metal wire layer 16 is connected to a bit line which is the other address wire of the memory element.

By applying electric potentials with different polarities between the lower electrode 1 and the upper electrode 4 of the resistance variable element 10 configured as described above, ion source of the ion source layer 3 constituting the storing layer is caused to migrate to the high-resistance layer 2. Or, the ion source is caused to migrate from the high-resistance layer 2 to the upper electrode 4. In this way, the resistance value of the resistance variable element 10 changes from a high-resistance state value to a low-resistance state value, or from the low-resistance state value to the high-resistance state value, so that data is stored.

Examples using binary transition metal oxides which are different from the resistance variable materials disclosed in Patent document 1 have been reported. For example, Patent document 2 discloses as resistance variable materials, NiO, $V_2O_5$, ZnO, $Nb_2O_5$, $TiO_2$, $WO_3$, and CoO. Since these materials are binary, control of compositions and layer forming of these materials are relatively easy. In addition, these materials may be relatively compatible with a semiconductor manufacturing process.

PRIOR ART DOCUMENTS

Patent Documents

Patent document 1: Japanese Laid-Open Patent Application Publication No. 2006-40946
Patent document 2: Japanese Laid-Open Patent Application Publication No. 2004-363604

SUMMARY OF THE INVENTION

Problems to be Solved by the Invention

However, the resistance variable element having a structure in which the transition metal oxide used as the above described conventional resistance variable material is sandwiched between two electrodes has the following problem.

The initial resistance of the transition metal oxide such as NiO is very high. To attain a resistance changing characteristic, it is necessary to apply electric pulses to the resistance variable element in an initial state to form an electric path within the resistance variable layer. This process is called a forming process. The voltages of the electric pulses in the forming process are relatively higher than the voltages of the electric pulses required to change, as a memory, the resistance variable material from the low-resistance state to the high-resistance state and from the high-resistance state to the low-resistance state, and therefore there is a need for a special circuit for generating such high voltages.

The present invention has been made under the circumstances, and an object of the present invention is to provide a manufacturing method of a resistance variable element which can decrease voltages of electric pulses required for a forming process and has reversible and stable rewrite characteristics, and of the resistance variable element which provides high compatibility with a semiconductor manufacturing process, and the resistance variable element.

Means for Solving the Problem

To achieve the above object, a resistance variable element of the present invention comprises: a first electrode; a second electrode; and a resistance variable layer which is interposed between the first electrode and the second electrode to contact the first electrode and the second electrode, the resistance variable layer being configured to reversibly change in response to electric signals with different polarities which are applied between the first electrode and the second electrode; the resistance variable layer having a stacked layer structure including two layers which are a first oxygen-deficient transition metal oxide layer; and a second oxygen-deficient transition metal oxide layer with higher oxygen content than the first oxygen-deficient transition metal oxide layer; the second oxygen-deficient transition metal oxide layer being in contact with the second electrode; and the second oxygen-deficient transition metal oxide layer having locally thinned portions.

The phrase "having locally thinned portions" means "having locally thinned portions" which can effectively decrease the voltages of the electric pulses required for the forming process. The concave and convex portions typically produced on the upper surface of the transition metal oxide layer, which result from a transition metal oxide layer deposition process such as sputtering or CVD when the transition metal oxide layer is deposited, are not included in the "having locally thinned portions."

In a preferred embodiment, the second oxygen-deficient transition metal oxide layer may have a plurality of concave portions to have the locally thinned portions at an interface between the second oxygen-deficient transition metal oxide layer and the second electrode.

In a preferred embodiment, the concave portions may be formed along grain boundaries of a material constituting the second electrode.

In a preferred embodiment, an interface between the first oxygen-deficient transition metal oxide layer and the second oxygen-deficient transition metal oxide layer may be flat, and an interface between the second oxygen-deficient transition metal oxide layer and the second electrode may have concave and convex portions to allow the second oxygen-deficient transition metal oxide layer to have the locally thinned portions.

In a preferred embodiment, the second electrode may have hillocks at an interface between the second oxygen-deficient transition metal oxide layer and the second electrode to allow the second oxygen-deficient transition metal oxide layer to have the locally thinned portions.

In a preferred embodiment, the second electrode may have hillocks at an interface between the second electrode and the second oxygen-deficient transition metal oxide layer.

In a preferred embodiment, the second electrode may comprise platinum or platinum alloy.

In a preferred embodiment, the locally thinned portions may have a thickness which is not less than 0.1 nm and not more than 5 nm.

In a preferred embodiment, the transition metal oxide layer may be a tantalum oxide layer.

A method of manufacturing a resistance variable element, of the present invention, comprises the steps of: forming a first electrode; forming a first oxygen-deficient transition metal oxide layer on the first electrode; forming a second oxygen-deficient transition metal oxide layer on the first oxygen-deficient transition metal oxide layer such that the second oxygen-deficient transition metal oxide layer has higher oxygen content than the first oxygen-deficient transition metal oxide layer; forming a second electrode layer comprising platinum or platinum alloy on the second oxygen-deficient transition metal oxide layer; and performing thermal treatment to form hillocks in the second electrode layer at an interface between the second electrode layer and the second oxygen-deficient transition metal oxide layer, after forming the second electrode layer.

Another method of manufacturing a resistance variable element, of the present invention, comprises the steps of: forming a first electrode; forming a first oxygen-deficient transition metal oxide layer on the first electrode; forming a second oxygen-deficient transition metal oxide layer on the first oxygen-deficient transition metal oxide layer such that the second oxygen-deficient transition metal oxide layer has higher oxygen content than the first oxygen-deficient transition metal oxide layer; forming a second electrode layer comprising palladium or palladium alloy on the second oxygen-deficient transition metal oxide layer; and performing thermal treatment to form hillocks in the second electrode layer at an interface between the second electrode layer and the second oxygen-deficient transition metal oxide layer, after forming the second electrode layer.

In a preferred embodiment, the thermal treatment may be performed at 350 degrees C. to 425 degrees C.

In a preferred embodiment, the transition metal may be tantalum.

In a preferred embodiment, the hillocks produced by the thermal treatment may have a height smaller than a thickness of the second oxygen-deficient transition metal oxide layer.

The above and further objects, features and advantages of the present invention will more fully be apparent from the following detailed description of preferred embodiments with reference to the accompanying drawings.

Advantage of the Invention

In accordance with the present invention, a resistance variable element which allows a forming process to be easily performed with electric pulses of relatively small voltages, has a reversible and stable rewrite characteristic, and utilizes a resistance changing phenomenon, and a manufacturing method thereof, are implemented.

BRIEF DESCRIPTION OF THE DRAWINGS

FIG. 11 is cross-sectional views showing exemplary schematic configurations of resistance variable elements according to modifications of the present invention, wherein FIG. 11(a) is a view showing modification 1, and FIG. 11(b) is a view showing modification 2.

FIG. 12 is transmission electron microscope (TEM) photographs showing cross-sections of a resistance variable element including a resistance variable layer comprising oxygen-deficient Ta oxide, in which FIG. 12(a) is a TEM photograph in a case where a maximum temperature in process steps is set to 400 degrees C., and FIG. 12(b) is a TEM photograph in a case where a maximum temperature in process steps is set to 100 degrees C.

FIG. 13 is transmission electron microscope (TEM) photographs showing cross-sections of a resistance variable element including a resistance variable layer comprising oxygen-deficient Hf oxide, in which FIG. 13(a) is a TEM photograph in a case where a maximum temperature in process steps is set to 400 degrees C., and FIG. 13(b) is a TEM photograph in a case where a maximum temperature in process steps is set to 100 degrees C.

FIG. 16 is transmission electron microscope (TEM) photographs showing cross-sections of a resistance variable element including a resistance variable layer comprising oxygen-deficient Ta oxide, in which FIG. 16(a) is the TEM photograph of a sample subjected to thermal treatment at 400 degrees C., FIG. 16(b) is the TEM photograph of the sample before thermal treatment, and 16(c) is the TEM photograph of a sample subjected to thermal treatment at 450 degrees C.

EMBODIMENTS FOR CARRYING OUT THE INVENTION

Figure 1:
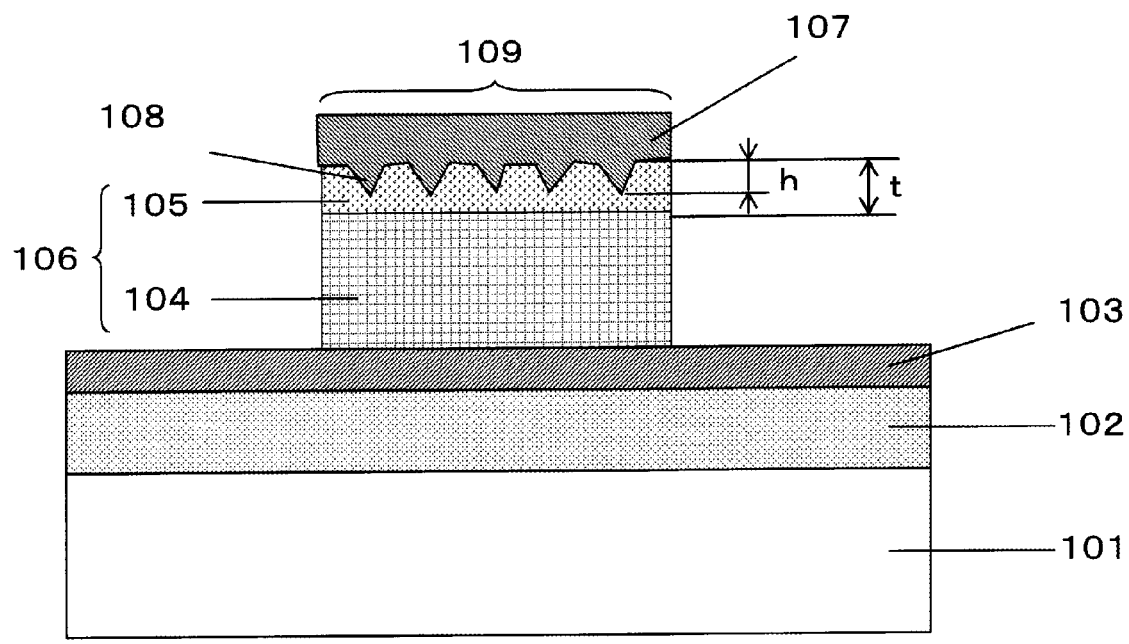
FIG. 1 is a cross-sectional view showing an exemplary configuration of a resistance variable element according to Embodiment 1 of the present invention.

Hereinafter, embodiments of the present invention will be described with reference to the drawings. Throughout the drawings, the same or corresponding constituents are designated by the same reference numerals and will not be described repetitively in some cases.

Embodiment 1

[Basic Data of the Present Invention]

Figure 12:
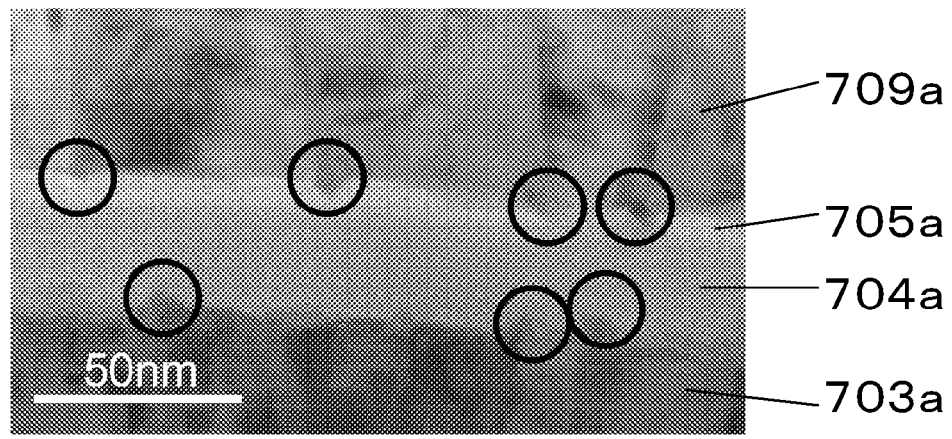
Figure 12:
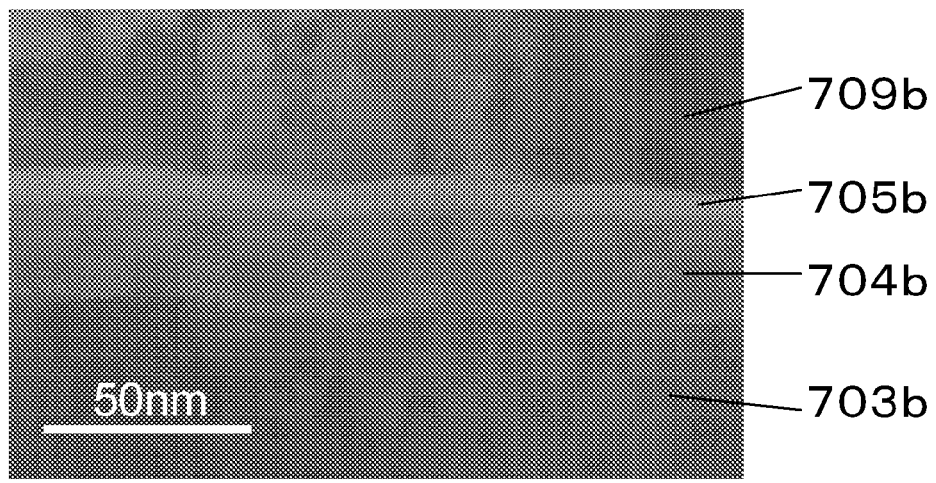

FIG. 12 is transmission electron microscope (TEM) photographs showing cross-sections of resistance variable elements including resistance variable layers comprising oxygen-deficient tantalum oxide, in which FIG. 12(a) is the TEM photograph in a case where a maximum temperature in process steps is set to 400 degrees C., and FIG. 12(b) is the TEM photograph in a case where a maximum temperature in process steps is set to 100 degrees C.

The element of FIG. 12(a) was manufactured in such a manner that a first oxygen-deficient tantalum oxide layer 704a with a thickness of about 23 nm, a second oxygen-deficient tantalum oxide layer 705a with a thickness of about 8 nm, and an upper electrode layer 709a comprising a Pt layer with a thickness of about 80 nm were stacked together in this order on a lower electrode layer 703a comprising a Pt layer with a thickness of about 50 nm. The oxygen content of the second oxygen-deficient tantalum oxide layer 705a was set higher than the oxygen content of the first oxygen-deficient tantalum oxide layer 704a. The element of FIG. 12(a) was manufactured by a process technique for manufacturing a semiconductor device. The maximum temperature in a heating step of the process steps was set to about 400 degrees C.

From a thorough study of FIG. 12(a), it is clear that when heating was conducted at 400 degrees C., minute hillocks (portions surrounded by circles in the photograph) comprising Pt were formed such that the hillocks protruded in an upward direction in the photograph from the lower electrode layer 703a and in a downward direction in the photograph from the upper electrode layer 709a, i.e., from the upper electrode toward the resistance variable layer and from the lower electrode toward the resistance variable layer. In other words, it may be said that the interface between each of the electrodes and the second oxygen-deficient tantalum oxide layer had concave and convex portions, because of the presence of the hillocks. Most of the hillocks extended from regions near grain boundaries of the upper and lower Pt layers. It should be especially notable that the hillocks extending from the upper electrode layer 709a reached approximately a half of the thickness of the second oxygen-deficient tantalum oxide layer.

The manufacturing method of the element shown in FIG. 12(b) was identical to that of the element of FIG. 12(a) except that the maximum temperature in the heating step of the process steps was set to about 100 degrees C. in the manufacturing method of the element of FIG. 12(b). As shown in FIG. 12(b), the hillocks comprising Pt did not appear. To be more specific, the hillocks extending from the lower electrode layer 703b toward the first oxygen-deficient tantalum oxide layer 704b or the hillocks extending from the upper electrode layer 709b toward the second oxygen-deficient tantalum oxide layer 705b did not appear.

For each of the elements, initial resistance (resistance value between the upper electrode layer and the lower electrode layer just after the completion of a sample manufacturing step including the heating step) was measured. The measured value of the sample (having Pt hillocks) shown in FIG. 12(a) was about $10^2 \Omega$, while the measured value of the sample (having no Pt hillocks) shown in FIG. 12(b) was about $10^8 \Omega$. Thus, the initial resistance of the sample having the hillocks was 6-digit lower.

This is because the second oxygen-deficient tantalum oxide layer had portions which were substantially thinner, where the hillocks were present, and had a smaller resistance value than portions having no element hillocks, as a whole.

As a mechanism of appearance of the hillocks, the following proposal was made. It was presumed that a change in the Pt layer in the heating step of the sample manufacturing process was a factor of the appearance of the hillocks. The minute hillocks might be produced in the second electrode by migration of Pt atoms under the condition in which the Pt layer reached a high-temperature state. It was presumed that the hillocks were grown from the grain boundaries of the Pt layer, because migration tended to occur along the grain boundaries of the Pt layer.

From an experiment conducted by the inventors, using Pt electrodes with thicknesses different from the above, although they are not shown in the drawings, it was confirmed that the hillocks were easily produced when the Pt electrode had a thickness of about 20 nm or more. This is possibly because the easiness of occurrence of the migration was related to the quantity of the Pt atoms.

In view of easiness of processing the Pt electrode, it is desired that the upper limit of the thickness of the Pt electrode be 200 nm or less.

Furthermore, the inventors confirmed whether or not a similar phenomenon occurred when Hf was used as transition metal included in the resistance variable layer, instead of Ta.

Figure 13:
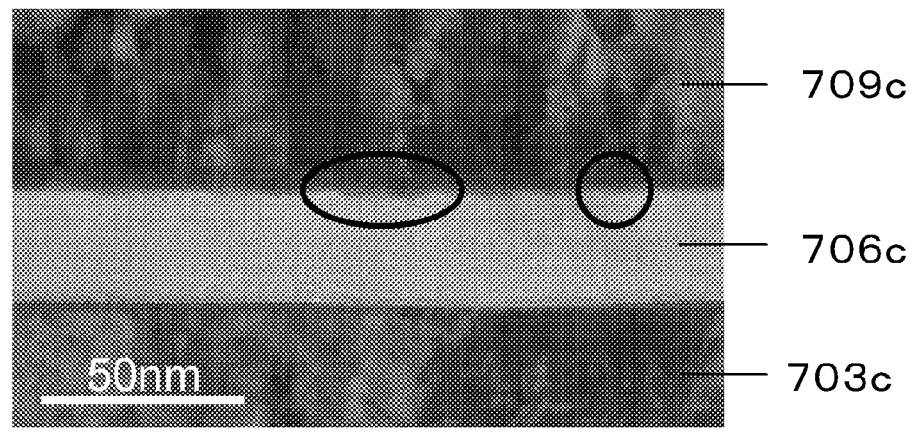
Figure 13:
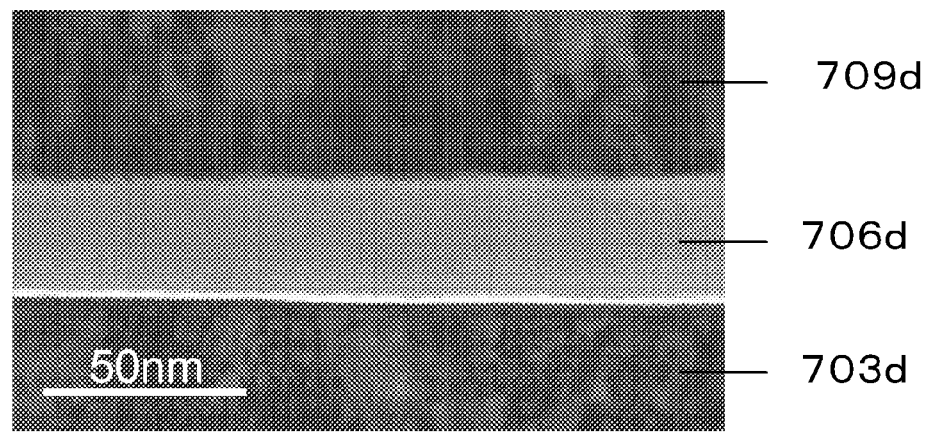

FIG. 13 is transmission electron microscope (TEM) photographs showing cross-sections of resistance variable elements including resistance variable layers comprising oxygen-deficient Hf oxide, in which FIG. 13(a) is the TEM photograph in a case where a maximum temperature in process steps is set to 400 degrees C., and FIG. 13(b) is the TEM photograph in a case where a maximum temperature in process steps is set to 100 degrees C.

The element of FIG. 13(a) was manufactured in such a manner that an oxygen-deficient Hf oxide layer 706c with a thickness of about 30 nm, and an upper electrode layer 709c comprising Pt with a thickness of about 75 nm were stacked together in this order on a lower electrode layer 703c comprising W (tungsten) with a thickness of about 150 nm. The element of FIG. 13(a) was manufactured by a process technique for manufacturing a semiconductor device. The maximum temperature in the heating step of the process steps was set to about 400 degrees C.

From a thorough study of FIG. 13(a), it is clear that when heating was conducted at 400 degrees C., broad hillocks comprising Pt (portions surrounded by circles in photograph) protruded in a downward direction in the photograph from the upper electrode layer 709c, i.e., from the upper electrode layer toward the resistance variable layer.

The element of FIG. 13(b) was manufactured in such a manner that the oxygen-deficient Hf oxide layer 706d with a thickness of about 30 nm and the upper electrode layer 709d comprising a Pt layer with a thickness of about 75 nm were stacked together in this order on the lower electrode layer 703d comprising a W layer with a thickness of about 150 nm. The maximum temperature in the heating step of the process steps for the element of FIG. 13(b) was set to about 100 degrees C. As shown in FIG. 13(b), the hillocks comprising Pt did not appear in the element for which the maximum temperature in the process steps was set to about 100 degrees C.

From the above results, it may be presumed that, in the resistance variable element including the Pt layer (electrode layer) with a larger thickness and the oxygen-deficient transition metal oxide as constituents, the Pt hillocks are more likely to be produced, in high-temperature atmosphere, which occurs regardless of the kind of the transition metal.

Although the electrode consists of Pt in the above example, it may be presumed that similar hillocks are produced in a material (alloy material substantially having a property of Pt) comprising Pt as a major component.

For a more thorough study of the relationship between the hillocks and the initial resistance, the inventors conducted an experiment as explained below.

[Initial Resistance of Resistance Variable Element]

Figure 14:
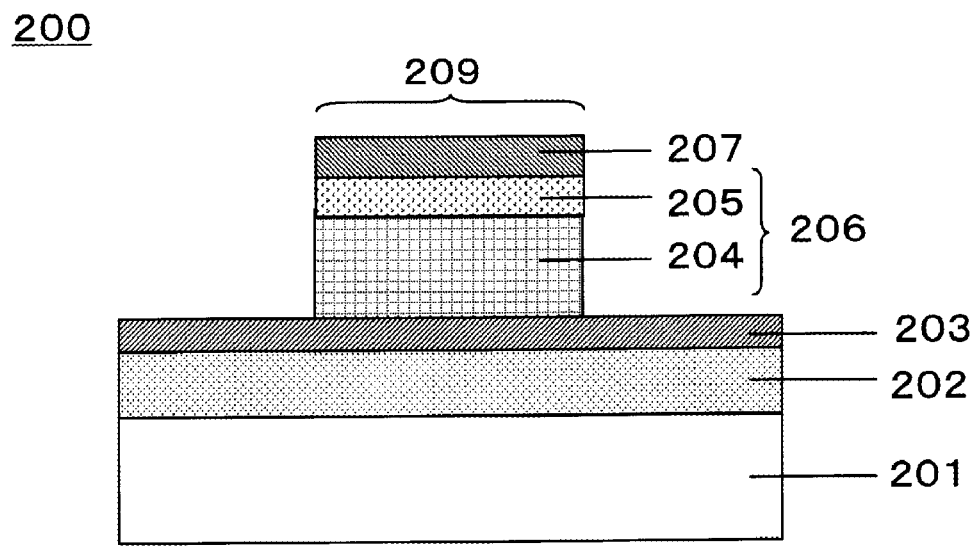
FIG. 14 is a cross-sectional view of a resistance variable element used in an experiment.

FIG. 14 shows an element (resistance variable element 200) used in the experiment. The resistance variable element 200 includes a substrate 201, an oxide layer 202 formed on the substrate 201, a first electrode layer 203 formed on the oxide layer 202, a second electrode layer 207, and a resistance variable layer 206 sandwiched between the first electrode layer 203 and the second electrode layer 207. To be more specific, the resistance variable layer 206 includes a first tantalum containing layer 204 (hereinafter referred to as "first tantalum oxide layer") with lower oxygen content and a second tantalum containing layer 205 (hereinafter referred to as "second tantalum oxide layer) with higher oxygen content which is formed on the first tantalum oxide layer.

Initially, a result of measurement of the initial resistances of the resistance variable element 200 which was thermally treated for 10 minutes at thermal treatment temperatures in a range from 300 degrees C. to 450 degrees C. in nitrogen atmosphere will be studied. In this case, a voltage of +0.4V which was lower than a threshold voltage (e.g., 1 V) was applied between the first electrode layer 203 and the second electrode layer 207 in each of the samples and a current flowing therethrough was measured, thereby obtaining the initial resistance of the resistance variable element 200.

Figure 15:
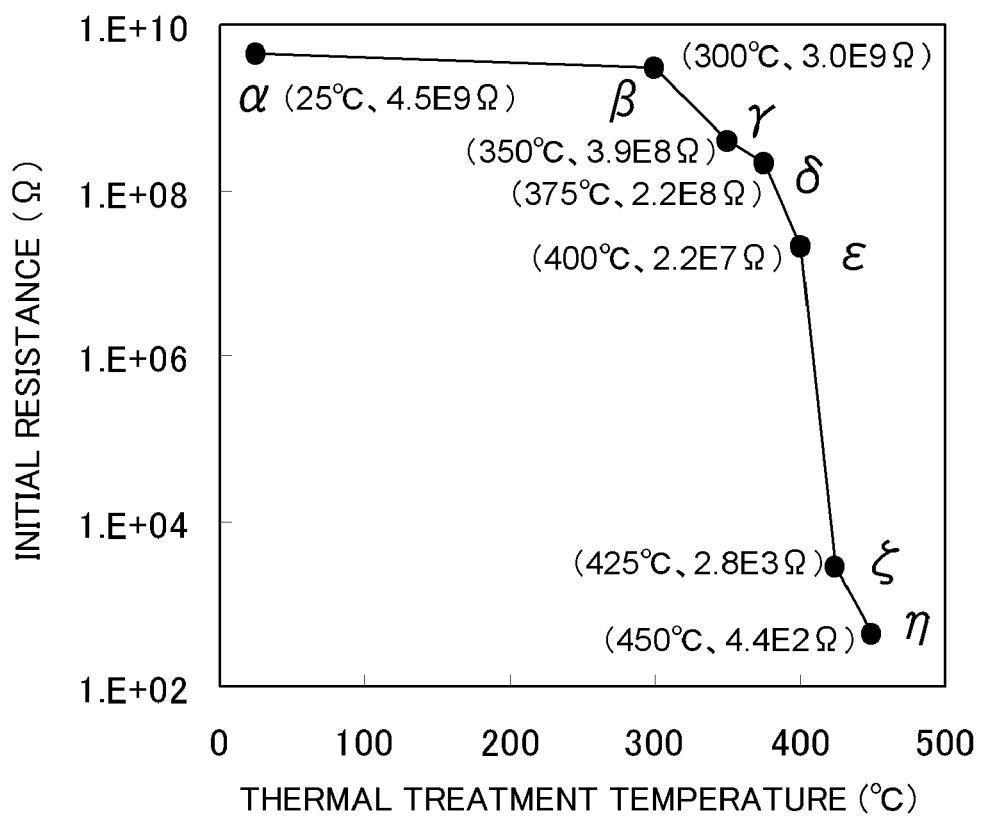
FIG. 15 is a view of thermal treatment temperature dependency of initial resistance of a resistance variable element 200.

FIG. 15 shows thermal treatment temperature dependency of the initial resistances of the resistance variable element 200. With reference to FIG. 15, the initial resistance of the resistance variable element 200 before thermal treatment was $4.5 \times 10^9 \Omega$ (indicated by $\alpha$ in FIG. 15), the initial resistance of the resistance variable element 200 subjected to thermal treatment at 300 degrees C. was $3.0 \times 10^9 \Omega$ (indicated by $\beta$ in FIG. 15), the initial resistance of the resistance variable element 200 subjected to thermal treatment at 350 degrees C. was $3.9 \times 10^8 \Omega$ (indicated by $\gamma$ in FIG. 15), the initial resistance of the resistance variable element 200 subjected to thermal treatment at 375 degrees C. was $2.2 \times 10^8 \Omega$ (indicated by $\delta$ in FIG. 15), the initial resistance of the resistance variable element 200 subjected to thermal treatment at 400 degrees C. was $2.2 \times 10^7 \Omega$ (indicated by $\epsilon$ in FIG. 15), the initial resistance of the resistance variable element 200 subjected to thermal treatment at 425 degrees C. was $2.8 \times 10^3 \Omega$ (indicated by $\zeta$ in FIG. 15), and the initial resistance of the resistance variable element 200 subjected to thermal treatment at 450 degrees C. was $4.4 \times 10^2 \Omega$ (indicated by $\eta$ in FIG. 15). As can be seen from these, the initial resistance of the resistance variable element 200 is lower as the thermal treatment temperature is higher.

[Observation of Cross-Section of Resistance Variable Element]

Figure 16:
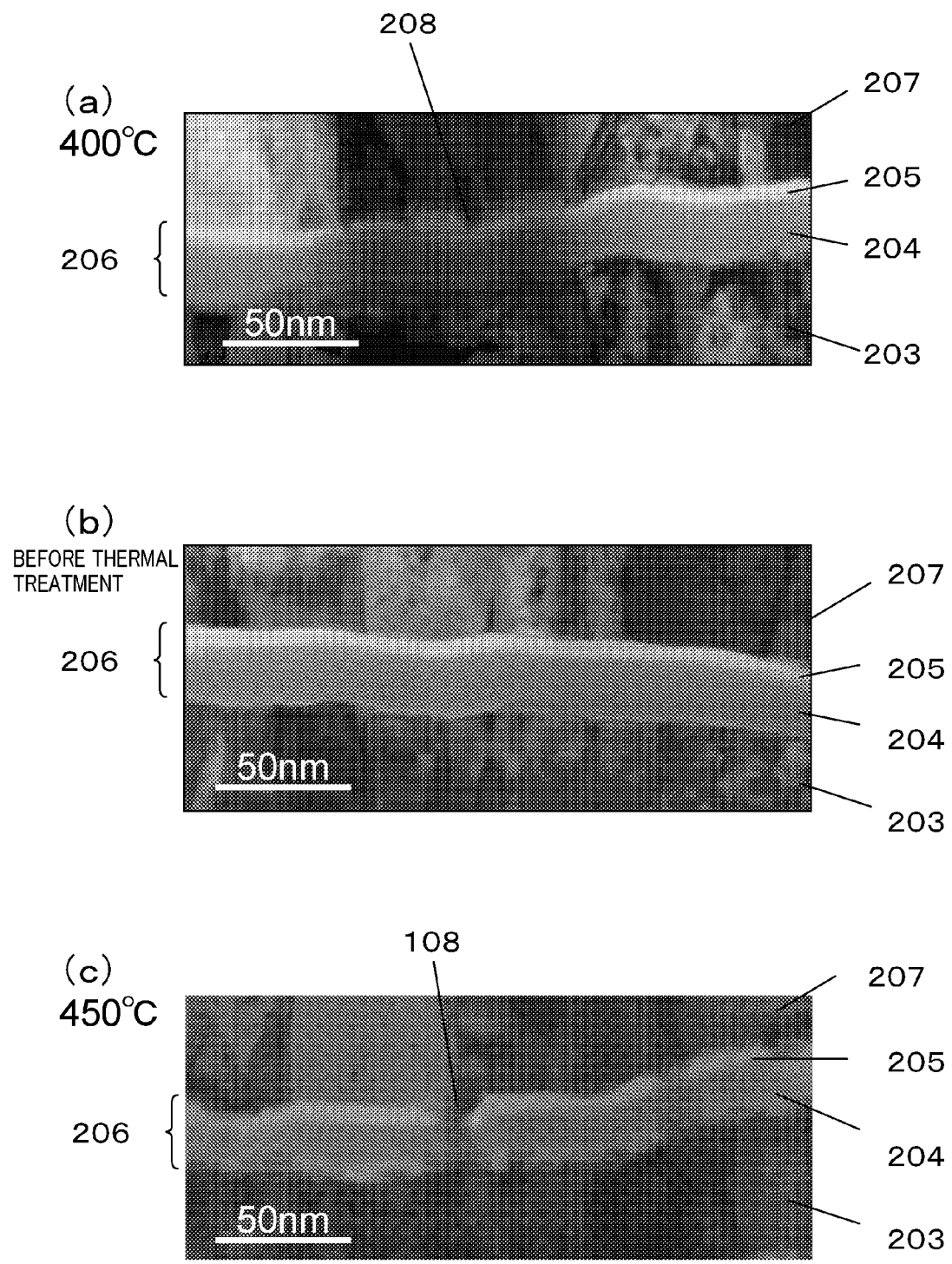
Figure 17:
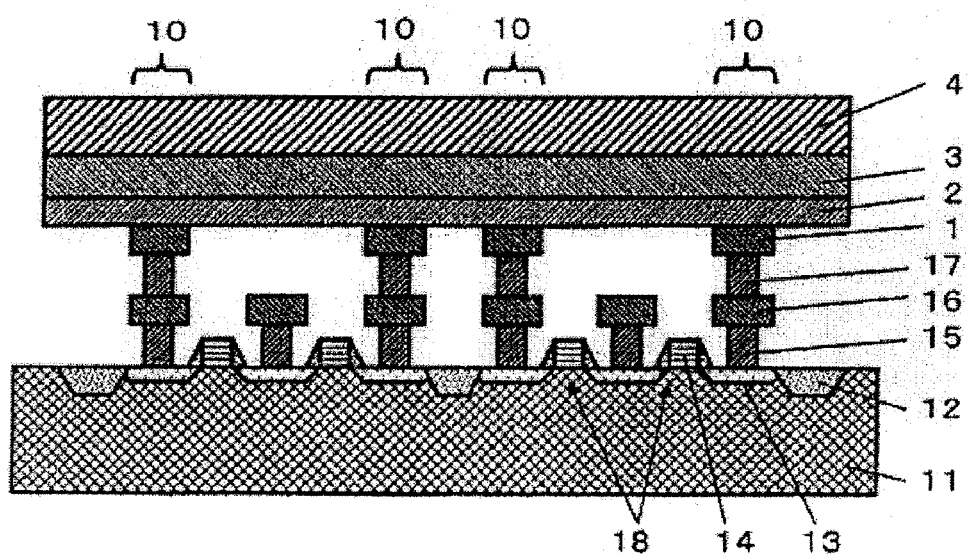
FIG. 17 is a cross-sectional view showing a configuration of a conventional memory element.

FIG. 16 shows the cross-sections of the first electrode layers 203, the resistance variable layers 206, and the second electrode layers 207 in the resistance variable elements 200 which were observed using the transmission electron microscope. FIG. 16(a) is a cross-sectional view of the sample subjected to thermal treatment at 400 degrees C., FIG. 16(b) is a cross-sectional view of the sample before thermal treatment, and FIG. 16(c) is a cross-sectional view of the sample subjected to thermal treatment at 450 degrees C.

As can be seen from FIG. 16(b), the resistance variable layer 206 sandwiched between the first electrode layer 203 and the second electrode layer 207 consisted of the first tantalum oxide layer 204 looking dark and the second tantalum oxide layer 205 looking bright. The thickness of the resistance variable layer 206 was about 30 nm, the thickness of the first tantalum oxide layer 204 was about 22 nm, and the thickness of the second tantalum oxide layer was about 8 nm. This result substantially conformed to analysis result of X-ray reflectometry.

As can be seen from FIG. 16(a), the resistance variable layer 206 consisted of the first tantalum oxide layer 204 and the second tantalum oxide layer 205, and minute hillocks protruded from the second electrode layer 207 toward the second tantalum oxide layer 205. According to analysis of the composition of the minute hillocks, it was found out that the minute hillocks contained as a major component Pt which was a material constituting the second electrode layer 207. The distance between the tip ends of the minute hillocks and the first tantalum oxide layer 204 was about 3 nm. Thus, it should be understood that the thickness of the second tantalum oxide layer 205 was made partially smaller because of the appearance of the minute hillocks.

As can be seen from FIG. 16(c), the resistance variable layer 206 consisted of the first tantalum oxide layer 204 and the second tantalum oxide layer 205, and minute hillocks protruded from the second electrode layer 207 toward the second tantalum oxide layer 205. Also, it can be seen that the tip ends of the minute hillocks reached the first tantalum oxide layer 204.

[Relationship Between Initial Resistance and Hillocks]

Hereinafter, consideration will be given of the above experiment result.

The thickness of the second tantalum oxide layer 205 in the sample before thermal treatment was about 8 nm, while the thickness of the portions of the second tantalum oxide layer 205, corresponding to the minute hillocks, in the sample subjected to thermal treatment at 400 degrees C., was about 3 nm, because of the appearance of the minute hillocks produced in the second electrode layer 207. In the sample subjected to the thermal treatment at 450 degrees C., the minute hillocks produced in the second electrode layer 207 penetrated the second tantalum oxide layer 205 such that their tip ends reached the first tantalum oxide layer 204. From the fact that the resistance of the second tantalum oxide layer 205 having a composition close to a stoichiometric composition $Ta_2O_5$ is very high, it may be presumed that the initial resistances of the resistance variable elements 200 are different due to a difference among the effective thicknesses of the second tantalum oxide layers of the above three kinds of samples.

From the above, it may be presumed that the minute hillocks were grown from the second electrode layer 207 comprising Pt, through the thermal treatment, and that the height of the minute hillocks was larger as the thermal treatment temperature was higher, which allowed the second tantalum oxide layer to have locally thinned portions, thereby resulting in a smaller than initial resistance of the resistance variable element 200.

Therefore, it was discovered that the hillocks can be grown with controllability by suitably controlling the heating step.

The present invention is based on the finding that the above mentioned minute hillocks contribute to reduction of a forming voltage. Hereinafter, an embodiment of the present invention will be described. Throughout the drawings, the same or corresponding constituents are designated by the same or corresponding reference numerals and will not be described repetitively.

[Configuration of Resistance Variable Element]

FIG. 1 is a cross-sectional view showing an exemplary configuration of a resistance variable element according to Embodiment 1 of the present invention.

As shown in FIG. 1, the resistance variable element 100 of this embodiment includes a substrate 101, an oxide layer 102 formed on the substrate 101, a first electrode layer 103 formed on the oxide layer 102, a second electrode layer 107 having minute hillocks 108, and a resistance variable layer 106 sandwiched between the first electrode layer 103 and the second electrode layer 107. The resistance variable layer 106 comprises an oxygen-deficient transition metal oxide, and includes the first oxygen-deficient transition metal oxide containing layer (hereinafter referred to as "first transition metal oxide layer") 104 with lower oxygen content, and the second oxygen-deficient transition metal oxide containing layer (hereinafter referred to as "second transition metal oxide layer") 105 with higher oxygen content, which is formed on the first oxygen-deficient transition metal oxide layer 104. The thickness t of the second transition metal oxide layer 105 is larger than the height h of the minute hillocks 108. The distance from the tip ends of the minute hillocks 108 to the first transition metal oxide layer 104 is t–h and is smaller than the distance t from portions of the second electrode layer 107 where no hillocks are present to the first transition metal oxide layer 104. The thickness t–h of the locally thinned portions of the second transition metal oxide layer is favorably about $0.1 \leq nm\ t-h \leq 5$ nm.

In other words, since the second transition metal oxide layer 105 (second oxygen-deficient transition metal oxide layer) has a plurality of concave portions at an interface between the second transition metal oxide layer 105 and the second electrode layer 107 (second electrode), the second transition metal oxide layer 105 has the locally thinned portions.

The concave portions are formed along the grain boundaries of the material constituting the second electrode layer 107. For example, there are a plurality of concave portions, corresponding to a plurality of minute hillocks 108 produced at the grain boundaries, respectively.

The interface between the first transition metal oxide layer 104 (first oxygen-deficient transition metal oxide layer) and the second transition metal oxide layer 105 is flat, whereas the interface between the second transition metal oxide layer 105 and the second electrode layer 107 has concave and convex portions to allow the second transition metal oxide layer 105 to have the locally thinned portions.

Since the second electrode layer 107 has hillocks at the interface between the second transition metal oxide layer 105 and the second electrode layer 107, the second transition metal oxide layer 105 has the locally thinned portions.

The "hillocks" need not be pointed. The shape of the "hillocks" may be a gently swelling shape. The tip ends of the "hillocks" do not desirably reach the first transition metal oxide layer 104. In other words, the "hillocks" do not desirably penetrate the second transition metal oxide layer 105. When there are a plurality of "hillocks", any one of them does not desirably penetrate the second transition metal oxide layer 105.

When the resistance variable element 100 is driven, voltages having predetermined conditions are applied between the first electrode layer 103 and the second electrode layer 107 by an external power supply. According to the directions in which the voltages are applied, the resistance values of the resistance variable layer 106 of the resistance variable element 100 reversibly increase or decrease. For example, when pulse voltages larger than a predetermined threshold voltage are applied, the resistance values of the resistance variable layer 106 increase or decrease, while when pulse voltages smaller than the threshold voltage are applied, the resistance values of the resistance variable layers 106 remain unchanged.

As the material of the first electrode layer 103, there are for example, Pt (platinum), Ir (iridium), W (tungsten), Cu (copper), Al (aluminum), TiN (titanium nitride), TaN (tantalum nitride), TiAlN (titanium aluminum nitride), and so on. The thickness of the first electrode layer 103 is set to about 20 nm to 200 nm.

To be precise, the thickness of the first electrode layer 103 is preferably set to not less than 20 nm and not more than 200 nm.

As the material of the second electrode layer 107, Pt (platinum) is preferable, and the thickness thereof is set to about 20 nm to 200 nm.

To be precise, the thickness of the second electrode layer 107 is preferably set to not less than 20 nm and not more than 200 nm. Alternatively, other materials may be added to platinum which is the electrode material of the second electrode layer, so long as similar hillocks protruding toward the resistance variable layer can be formed.

Now it is assumed that the transition metal is tantalum. When the oxygen-deficient tantalum oxide included in the first transition metal oxide layer 104 is expressed as $TaO_x$ and the oxygen-deficient tantalum oxide included in the second transition metal oxide layer 105 is expressed as $TaO_y$, $0<x<2.5$, $0<y<2.5$, and $x<y$ are satisfied. $TaO_y$ is preferably $TaO_y$ ($2.1 \leq y \leq 2.5$). $TaO_x$ is preferably $TaO_x$ ($0.8 \leq x \leq 1.9$). The compositions of the transition metal oxide layers can be measured using Rutherford backscattering method.

The thickness of the first transition metal oxide layer is set to 5 nm to 100 nm and the thickness of the second transition metal oxide layer is set to 1 nm to 10 nm.

To be precise, the thickness of the first transition metal oxide layer is preferably set to not less than 5 nm and not more than 100 nm and the thickness of the second transition metal oxide layer is set to not less than 1 nm and not more than 10 nm.

The substrate 101 may be a monocrystal silicon substrate or a semiconductor substrate, but is not limited to these. Since the resistance variable layer 106, the second electrode layer 107 and the minute hillocks 108 can be formed at a relatively low substrate temperature, the resistance variable layer 106 can be formed on a polyimide resin material or the like.

[Manufacturing Method of Resistance Variable Element]

Next, a manufacturing method of the resistance variable element 100 of this embodiment will be described.

Initially, over the substrate 101 which is monocrystal silicon, the oxide layer 102 with a thickness of about 200 nm is formed by thermal oxidation. Then, the first electrode layer 103 is deposited over the oxide layer 102 by sputtering.

Then, over the first electrode layer 103, the first transition metal oxide layer 104 is deposited by reactive sputtering using a transition metal target. Oxygen plasma is emitted to the uppermost portion of the first transition metal oxide layer 104 to reform the same.

In this case, with the substrate 101 heated up to 250 degrees C., oxygen plasma is emitted to the uppermost portion of the first transition metal oxide layer 104 for 30 seconds. As a result, the second transition metal oxide layer 105 with higher oxygen content than the first transition metal oxide layer 104 is formed over the surface of the first transition metal oxide layer 104. The resistance variable layer 106 has a stacked layer structure in which the first transition metal oxide layer 104 and the second transition metal oxide layer 105 are stacked together.

Then, over the second transition metal oxide layer 105, the Pt thin layer with a thickness of 150 nm as the second electrode layer 107 is deposited by sputtering. In this case, the second electrode layer 107 is deposited under the same conditions that the first electrode layer 103 is deposited.

After forming the second electrode layer 107, the resulting structure is thermally treated in nitrogen atmosphere at 350 to 425 degrees C. for about 10 to 30 minutes.

To be precise, the thermal treatment temperature is preferably not lower than 350 degrees C. and not higher than 425 degrees C., and the thermal treatment time is preferably not less than 10 minutes and not more than 30 minutes.

EXAMPLE

According to the above mentioned manufacturing method, a sample of example and a sample of comparative example were manufactured. Hereinafter, this will be described in detail.

In this example, tantalum was used as the transition metal oxide. Therefore, the resistance variable layer 106 comprised the oxygen-deficient tantalum oxide, and included the first tantalum oxide containing layer (hereinafter referred to as "first tantalum oxide layer") 104 with lower oxygen content and the second tantalum oxide containing layer (hereinafter referred to as "second tantalum oxide layer") 105 with higher oxygen content, which was formed on the first tantalum oxide layer 104.

Initially, as described above, after forming the stacked layer structure of the substrate 101, the oxide layer 102 and the first electrode layer 103 (Pt, 100 nm), the first tantalum oxide layer 104 was deposited over the first electrode layer 103. The layer deposition conditions were such that degree of vacuum (back pressure) within a sputtering device before starting sputtering was about $7 \times 10^{-6}$ Pa, a power during sputtering was 250 W, a total gas pressure of an argon gas and an oxygen gas was 3.3 Pa, a partial pressure ratio of an oxygen gas was 3.8%, a set temperature of the substrate was 30 degrees C., and a layer deposition time was 7 minutes. As a result, the first tantalum oxide layer 104 having oxygen content of about 58%, i.e., expressed as $TaO_{1.4}$, and having a thickness of 30 nm was deposited.

After depositing the first tantalum oxide layer 104 as described above, oxygen plasma was emitted for 30 sec to the first tantalum oxide layer 104 under the state where the resulting structure was heated at 250 degree C., thereby oxidating the uppermost layer of the first tantalum oxide layer 104 with oxygen plasma. As a result, the second tantalum oxide layer 105 with higher oxygen content than the first tantalum oxide layer 104 was formed on the surface of the first tantalum oxide layer 104. Although the second tantalum oxide layer 105 was formed by reforming the surface of the first tantalum oxide layer 104 by oxygen plasma treatment in Embodiment 1, it may be formed by thermal treatment in oxygen atmosphere, sputtering using $Ta_2O_5$, etc.

Then, as described above, over the second tantalum oxide layer 105, the second electrode layer 107 comprising the Pt thin layer was deposited. The layer deposition conditions were such that degree of vacuum (back pressure) within a sputtering device before starting sputtering was about $7 \times 10^{-6}$ Pa, a power during sputtering was 250 W, a pressure of an argon gas was 3.3 Pa, a set temperature of the substrate was 200 degrees C., and a layer deposition time was 3 minutes. As a result, the second electrode layer 107 with 150 nm was deposited.

Then, an element region 109 was processed by lithography and dry etching to form a square of 0.5 μm and 0.5 μm.

After depositing the second electrode layer 107, the resulting structure was thermally treated in nitrogen atmosphere at 400 degrees C. for 10 minutes to form the minute hillocks 108, thereby manufacturing a sample of example. As comparative example 1, a sample was produced in such a manner that the resulting structure was not subjected to thermal treatment at 400 degrees C. for 10 minutes after the second electrode layer 107 was deposited such that the second electrode layer 107 did not have the minute hillocks 108. As comparative example 2, a sample was produced in such a manner that the resulting structure was subjected to thermal treatment at 450 degrees C. for 10 minutes after the second electrode layer 107 was deposited such that the second electrode layer 107 had the minute hillocks 108 whose height h was substantially equal to the thickness t of the second tantalum oxide layer 105.

Hereinafter, characteristics and the like of the samples of example and comparative example 1 and comparative example 2 manufactured as described above will be described.

[Forming Process of Resistance Variable Element]

Next, the forming process for the sample obtained by thermally treating the resistance variable element 100 for 10 minutes in nitrogen atmosphere at thermal treatment temperatures from 300 degrees to 450 degrees C. will be described. In present specification, the forming process is defined as a process in which an electric pulse is applied once to the element just after the manufacturing. The polarity of the electric pulses is a polarity with which the initial resistance which is the resistance value of the element just after the manufacturing decreases, more specifically, a polarity with which an electrode provided with a high-concentration oxide layer is relatively negative.

Figure 2:
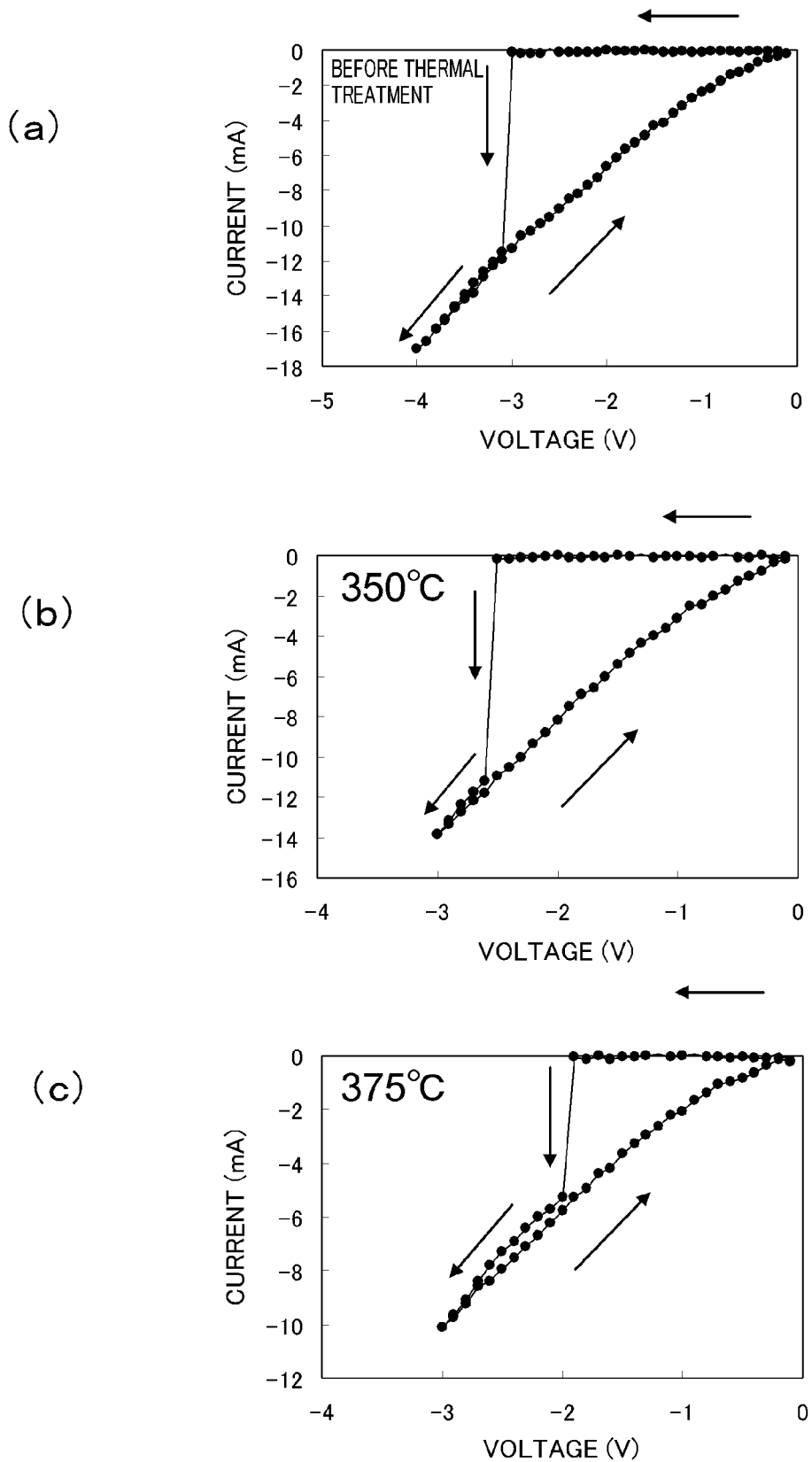
FIG. 2 is a view showing current-voltage characteristics of the resistance variable element according to Embodiment 1 of the present invention, in a forming process.
Figure 3:
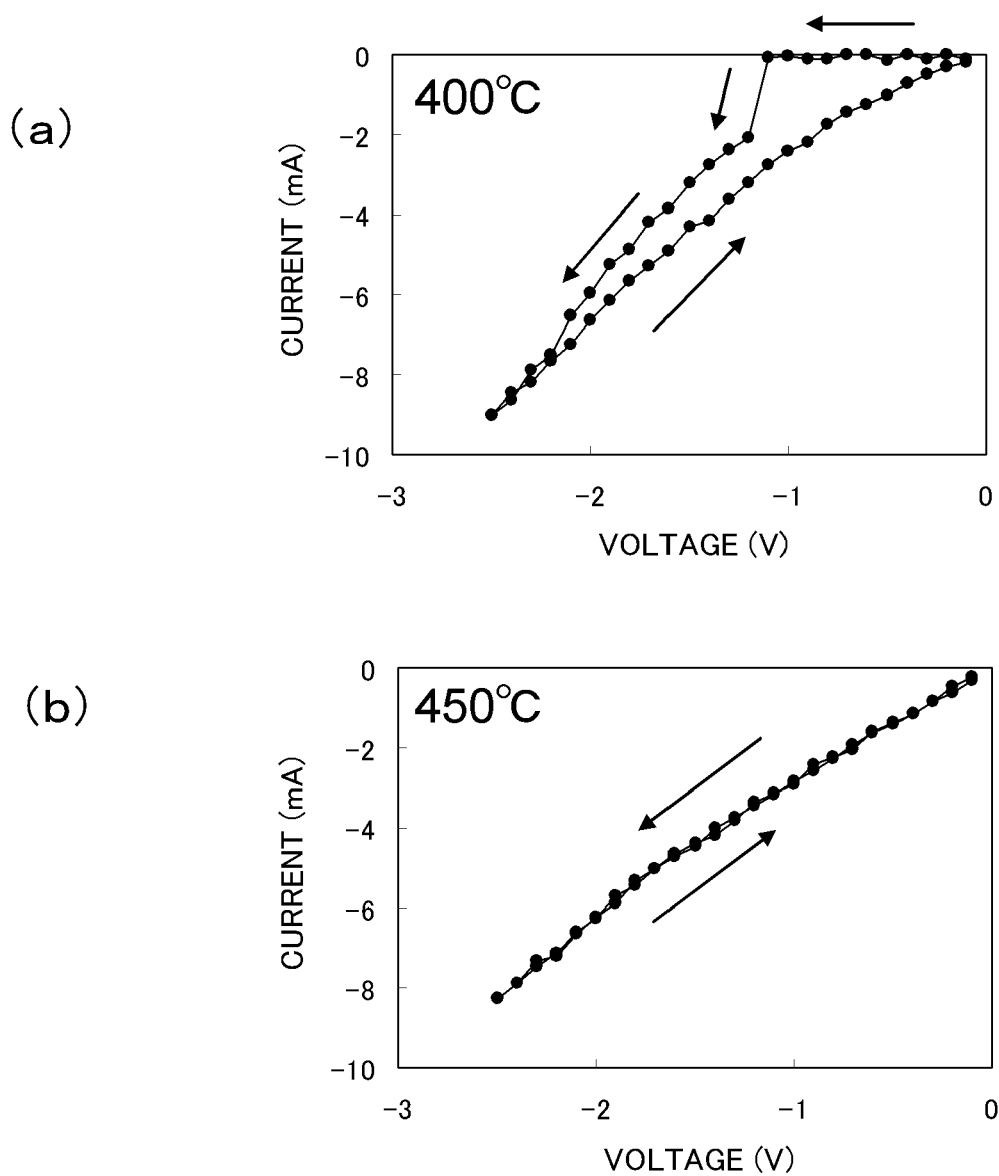
FIG. 3 is a view showing current-voltage characteristics of the resistance variable element according to Embodiment 1 of the present invention, in a forming process.

FIG. 2 shows current-voltage characteristics obtained by measuring voltages and currents in cases where an electric pulse of a negative polarity and a pulse width of 100 nsec is applied between the first electrode layer 103 and the second electrode layer 107 in the resistance variable element 100. FIG. 2(a) shows the current-voltage characteristic of the sample before thermal treatment. FIG. 2(b) shows the current-voltage characteristic of the sample subjected to thermal treatment at 350 degrees C. FIG. 2(c) shows the current-voltage characteristic of the sample subjected to thermal treatment at 375 degrees C. FIG. 3(a) shows the current-voltage characteristic of the sample subjected to thermal treatment at 400 degrees C. FIG. 3(b) shows the current-voltage characteristic of the sample subjected to thermal treatment at 450 degrees C.

Figure 4:
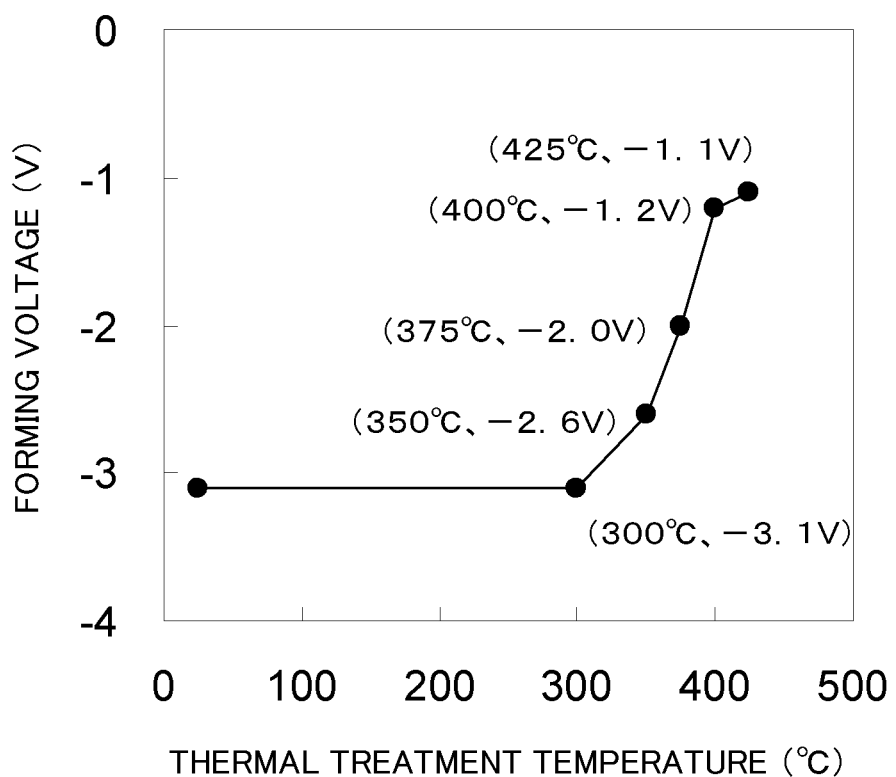
FIG. 4 is a view showing thermal treatment temperature dependency of a forming voltage of the resistance variable element according to Embodiment 1 of the present invention.

As can be seen from FIG. 2(a), substantially no current flows through the sample before the thermal treatment at voltages smaller than −3.1V, and the resistance variable element 100 is in a high-resistance state, but a current of about 11 mA flows therethrough, and the resistance value drastically drops at a voltage of −3.1V. As can be seen from FIG. 2(b), substantially no current flows through the sample subjected to thermal treatment at 350 degrees C. at voltages smaller than −2.6V, and the resistance variable element 100 is in a high-resistance state, but a current of about 11 mA flows therethrough, and the resistance value drastically drops at a voltage of −2.6V. As can be seen from FIG. 2(c), substantially no current flows through the sample subjected to thermal treatment at 375 degrees C. at voltages smaller than −2.0V, and the resistance variable element 100 is in a high-resistance state, but a current of about 5 mA flows therethrough, and the resistance value drastically drops at a voltage of −2.0V. As can be seen from FIG. 3(a), substantially no current flows through the sample subjected to thermal treatment at 400 degrees C. at voltages smaller than −1.2V, and the resistance variable element 100 is in a high-resistance state, but a current of about 2 mA flows therethrough, and the resistance value drastically drops at a voltage of −1.2V. With reference to FIG. 3(b), the sample subjected to thermal treatment at 450 degrees C. has an initial resistance as small as several hundreds Ω and does not cause resistance change even though a negative voltage is applied thereto. FIG. 4 shows voltages (hereinafter referred to as forming voltages) with which currents abruptly flow and resistance values decrease in the current-voltage characteristics of samples subjected to thermal treatment at temperatures made different from each other.

As can be seen from FIG. 4, in the forming process, negative voltages of about −3.1V are required for the sample before thermal treatment and the sample subjected to thermal treatment at 300 degrees C. Also, as can be seen, the forming process can occur in the samples subjected to thermal treatment at 350 degrees C. to 425 degrees C., with smaller voltages than in the sample before thermal treatment. In particular, as can be seen, the forming process can occur in the samples subjected to thermal treatment at 400 degrees C. to 425 degrees C. with negative voltages smaller than 1.5V in absolute value.

Figure 5:
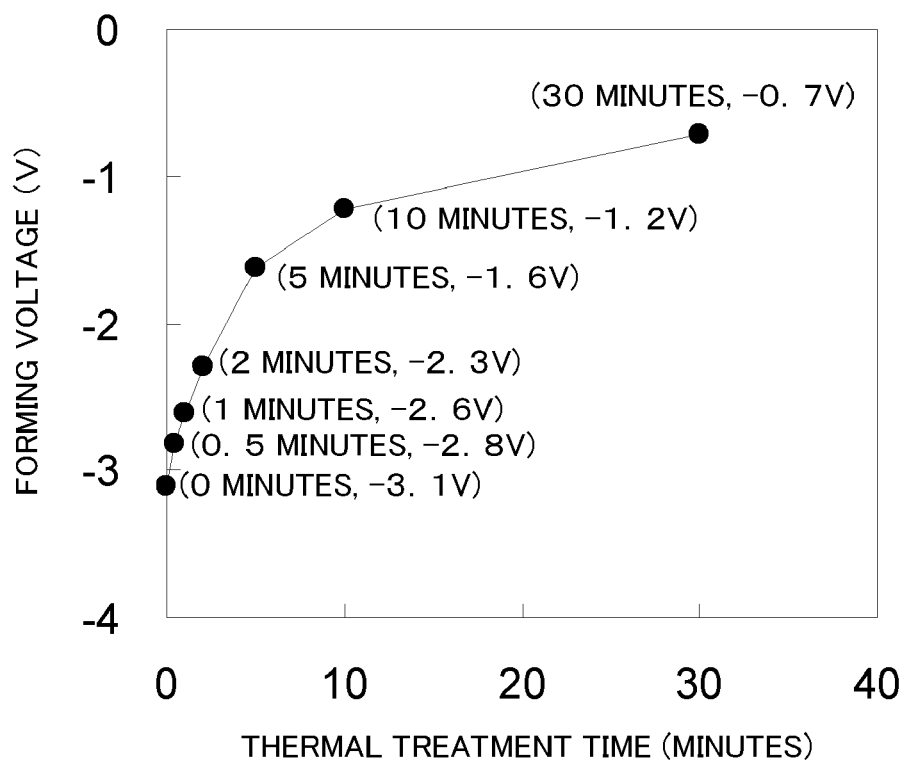
FIG. 5 is a view showing thermal treatment time dependency of the forming voltage of the resistance variable element according to Embodiment 1 of the present invention.

As described above, the forming voltage is varied depending on the thermal treatment temperature. Next, how the forming voltage is varied depending on the thermal treatment time at the thermal treatment temperature of 400 degrees C. will be described. FIG. 5 shows thermal treatment time dependency of the forming voltage. As can be seen, there is a tendency that the absolute value of the forming voltage drastically drops for initial thermal treatment time 10 minutes and is gradually saturated.

Now, the results shown in FIGS. 4 and 5 will be analyzed based on consideration described in "relationship between initial resistance and hillocks." Since the absolute value of the forming voltage continuously decreases according to the thermal treatment temperature and the thermal treatment time, it should be understood that the forming voltage is smaller as the difference t−h (thickness of the locally thinned portions of the second tantalum oxide layer) between the height of the minute hillocks 108 and the thickness of the second tantalum oxide layer 105 is smaller. Therefore t−h is preferably as small as possible. However, in view of physically limited operability of the resistance variable layer, the lower limit value of t−h is assumed as about 0.1 nm.

As can be clearly seen from FIG. 5, the forming voltages are effectively decreased in cases where the heating time is as short as about 0.5 minute and one minute. This implies that this effect is produced because of presence of even a few hillocks.

The reason why the forming voltage is decreased because of the presence of the hillocks is not clarified. But, it may be presumed that a decrease in the forming voltage is related to a mechanism of a resistance changing phenomenon. It may be presumed that the resistance changing phenomenon occurs in a region of a high-concentration oxide layer, and the forming process causes formation of the region where the resistance changing phenomenon occurs. Since an electric filed concentrates at the region in the vicinity of the tip ends of the minute hillocks, the region where the resistance changing phenomenon occurs is easily formed.

It may be presumed that similar advantage is achieved without using the Pt electrode having hillocks, so long as the second transition metal oxide layer has locally thinned portions, because the electric field is intensively applied to the thinned portions.

The inventors conducted an experiment to thoroughly study the relationship between the thickness (t–h in FIG. 1) of the locally thinned portions of the second transition metal oxide layer and the forming voltage, as described below.

Figure 6:
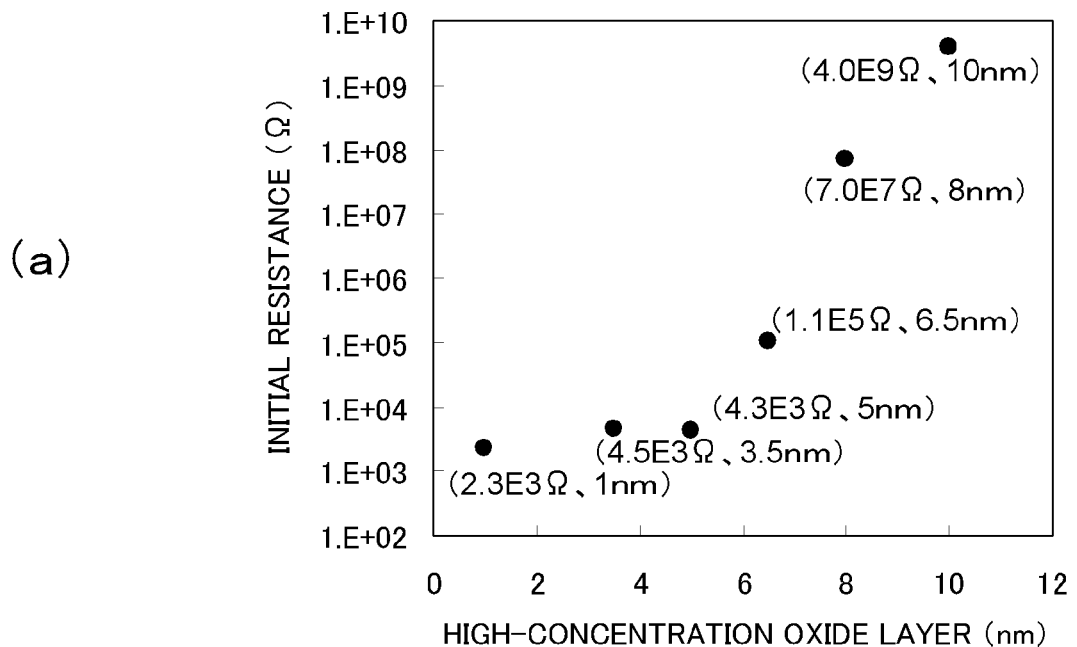
FIG. 6(a) is a view showing a relationship between the thickness of the second tantalum oxide layers and the initial resistance of the resistance variable layers.
FIG. 6(b) is a view showing the thickness of the second tantalum oxide layer and the forming voltage.
Figure 6:
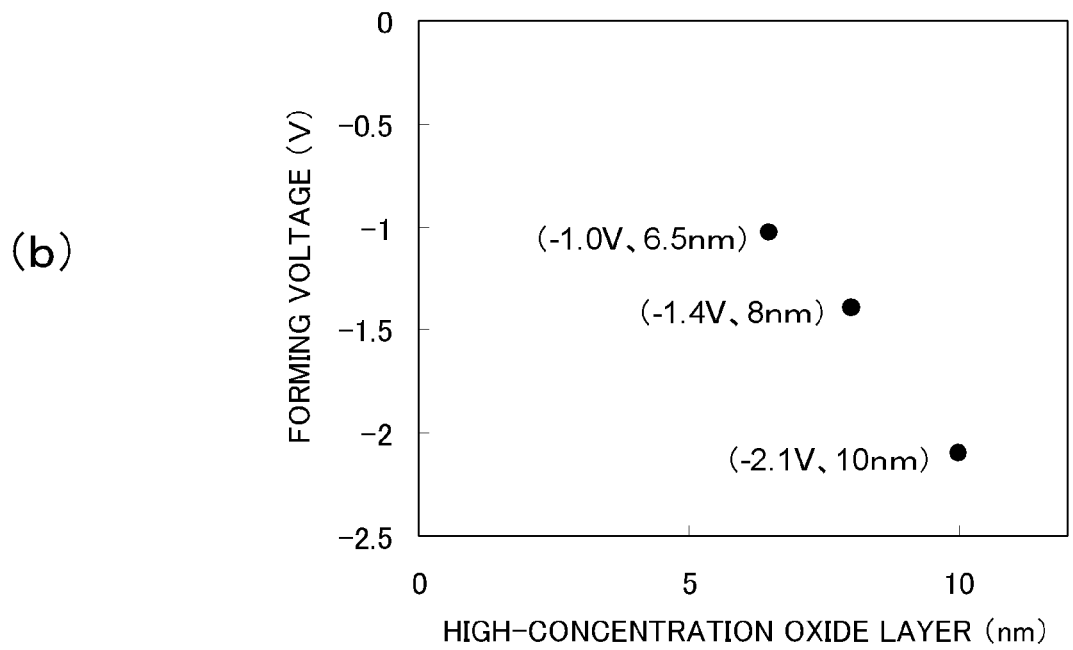

FIG. 6(a) shows measured values of initial resistances of samples including as the resistance variable layers 106, second tantalum oxide layers comprising oxygen-deficient tantalum oxide and being different in thickness, after thermally treating the samples at 400 degrees C. for about 10 minutes.

FIG. 6(b) shows measured values of the forming voltages of the samples being different in thicknesses after thermally treating the samples at 400 degrees C. for about 10 minutes.

As shown in FIG. 6(a), the initial resistance values of the samples including the second tantalum oxide layers with thicknesses of about 5 nm or less were about several $10^3 \Omega$, while the initial resistance value of the sample including the second tantalum oxide layer with a thickness of 6.5 nm was about $10^5 \Omega$, and the initial resistance value of the sample including the second tantalum oxide layer with a thickness of 8 nm was about $10^8 \Omega$. In other words, the samples including the second tantalum oxide layers with thicknesses of about 5 nm or less exhibit substantially equal resistance values, and, when in each of the samples including second tantalum oxide layers with thicknesses of 6 nm or more, the resistance value is larger as the thickness is larger.

The TEM image of FIG. 16(a) shows that hillocks of about 5~6 nm were grown by thermal treatment at 400 degrees C. for about 10 minutes, which conformed to the result of FIG. 6(a). It may be presumed that in each of the samples including the second tantalum oxide layers with thicknesses of 5 nm or less, the upper electrode was electrically connected to the first tantalum oxide layer via the hillocks, and therefore the resistance value was smaller.

It may be presumed that in the samples including the second tantalum oxide layers with thicknesses of 6 nm or more, as the thickness of the second tantalum oxide layer was larger, the distance (t–h) from the tip ends of the hillocks to the first tantalum oxide layer was longer, and therefore the resistance value was larger.

FIG. 6(b) shows very favorable results that the forming voltage of the sample including the second tantalum oxide layer with a thickness of 6.5 nm was –1.0V, the forming voltage of the sample including the second tantalum oxide layer with a thickness of 8 nm was –1.4V, and the forming voltage of the sample including the second tantalum oxide layer with a thickness of 10 nm was –2.1V. From the fact that the hillocks of about 5~6 nm were grown by thermal treatment at 400 degrees C. for about 10 minutes, it is presumed that the difference t–h between the height of the minute hillocks 108 and the thickness of the second tantalum oxide layer 105 was 0.5~1.5 nm in the sample including the second tantalum oxide layer with a thickness of 6.5 nm, about 2~3 nm in the sample including the second tantalum oxide layer with a thickness of 8 nm, and about 4~5 nm in the sample including the second tantalum oxide layer with a thickness of 10 nm.

In view of the above, to make the forming voltage smaller, the difference between the height of the minute hillocks 108 and the thickness of the second tantalum oxide layer 105, i.e., the thickness t–h of the locally thinned portions of the second tantalum oxide layer may be desirably 0.5 nm t–h 5 nm. In addition, as described later, it is essential that the second tantalum oxide layer be present between the second electrode layer and the first tantalum oxide layer to enable the resistance changing phenomenon to occur, and therefore the thickness t–h of the locally thinned portions of the second tantalum oxide layer may be desirably 0.1 nm t–h 5 nm.

[Resistance Changing Characteristic of Resistance Variable Element]

Next, exemplary operations of the memories of example and comparative examples, i.e., exemplary operations in a case where data is written or read, will be described with reference to the drawings.

Figure 7:
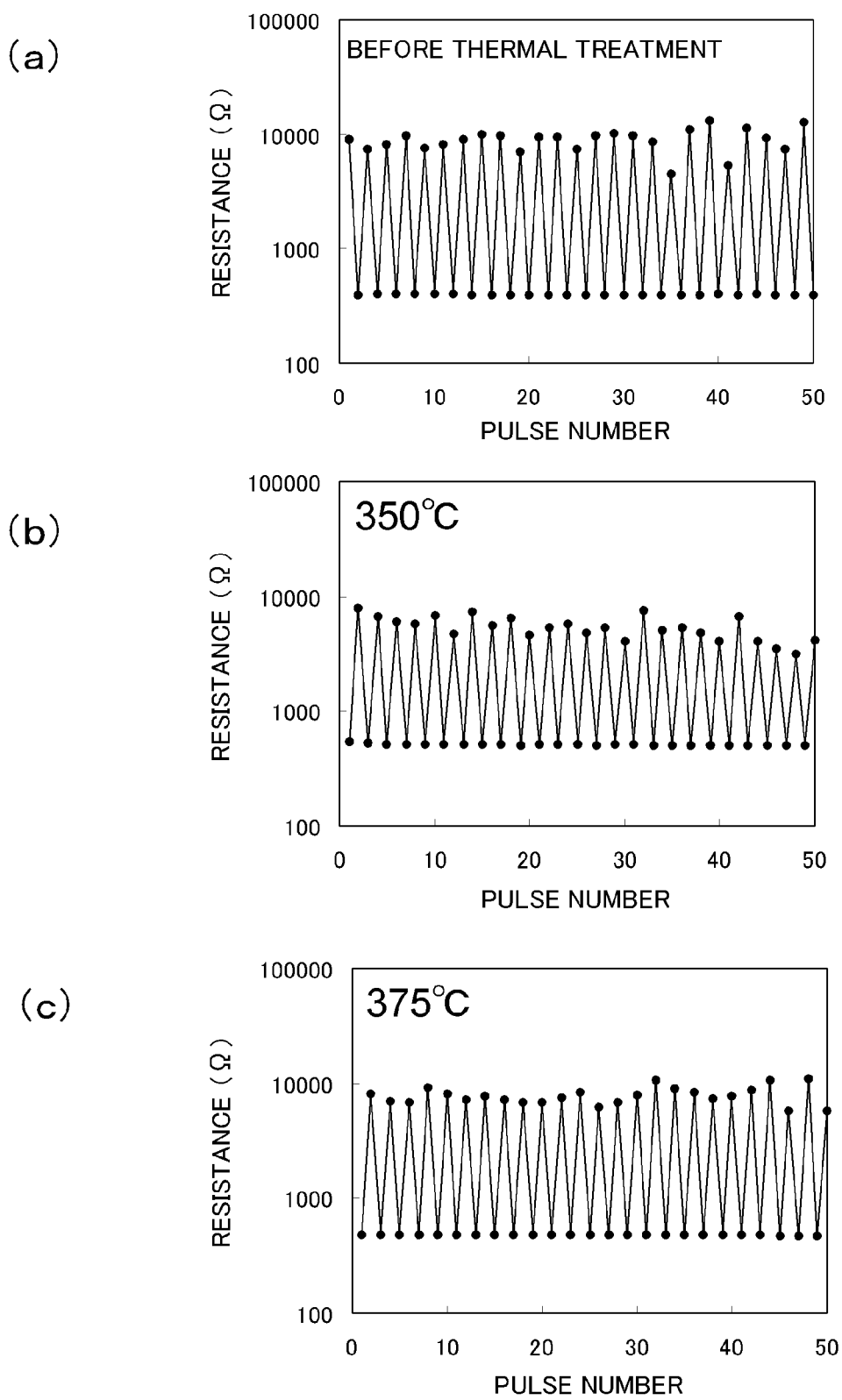
FIG. 7 is a view showing a relationship between the resistance values and the number of pulse applications in the resistance variable element according to Embodiment 1 of the present invention.
Figure 8:
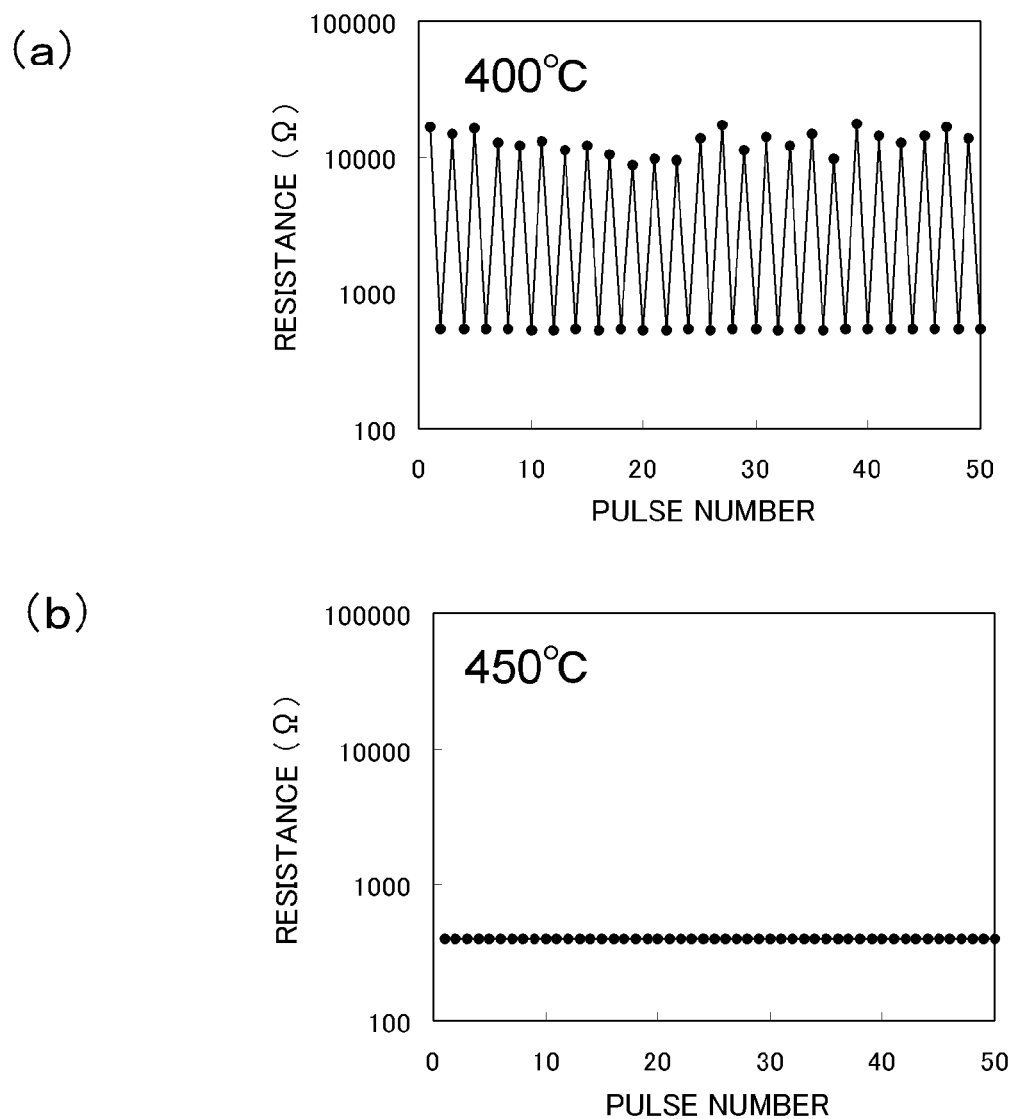
FIG. 8 is a view showing a relationship between the resistance values and the number of pulse applications in the resistance variable element according to Embodiment 1 of the present invention.

FIGS. 7 and 8 are views showing exemplary operations in cases where electric pulses with a pulse width of 100 nsec and different polarities are applied alternately between the first electrode layer 103 and the second electrode layer 107 in the resistance variable element 100. FIG. 7(a) shows the exemplary operation of the sample before thermal treatment, FIG. 7(b) shows the exemplary operation of the sample subjected to thermal treatment at 350 degrees C., FIG. 7(c) shows the exemplary operation of the sample subjected to thermal treatment at 375 degrees C., FIG. 8(a) shows the exemplary operation of the sample subjected to thermal treatment at 400 degrees C., and FIG. 8(b) shows the exemplary operation of the sample subjected to thermal treatment at 450 degrees C.

When two kinds of electric pulses with a pulse width of 100 nsec and different polarities are applied alternately between the first electrode layer 103 and the second electrode layer 107 in the sample of example subjected to thermal treatment at 400 degrees C., the resistance values of the resistance variable element 100 change as shown in FIG. 8(a). To be specific, when a negative voltage pulse (voltage E1, pulse width 100 nsec) is applied between the electrodes, the resistance value of the resistance variable element 100 decreases from a high-resistance value Rb (about 20000Ω) to a low-resistance value Ra (about 500Ω). On the other hand, when a positive voltage pulse (voltage E2, pulse width 100 nsec) is applied between the electrodes, the resistance value of the resistance variable element 100 increases from the low-resistance value Ra to the high-resistance value Rb. In this case, the voltage E1 is set to –1.3V and the voltage E2 is set to +1.5V.

In the example of FIG. 8(a), the high-resistance value Rb is allocated to data "0" and the low-resistance value Ra is allocated to data "1." By applying the positive voltage pulse between the electrodes so that the resistance value of the resistance variable layer 106 reaches the high-resistance value Rb, data "0" is written to the resistance variable element 100, while by applying the negative voltage pulse between the electrodes so that the resistance value of the resistance variable layer 106 reaches the low-resistance value Ra, data "1" is written to the resistance variable element 100.

When reading data from the resistance variable element 100, a read voltage E3 (|E3|<|E1|, |E3|<|E2|) having a smaller amplitude than the electric pulse applied between the first electrode layer 103 and the second electrode layer 107 to change the resistance value of the resistance variable element 100 is applied between the electrodes. As a result, a current corresponding to the resistance value of the resistance variable layer 106 is output and its output current value is detected, thereby allowing written data to be read.

As described above, the region of the resistance variable layer 106 sandwiched between the first electrode layer 103 and the second electrode layer 107 is operative as a memory section, thereby enabling the example 1 to be operative as a memory.

As can be seen from FIG. 7(a), the forming voltage of the sample before thermal treatment is high, but the sample subjected to the forming process exhibits resistance change in substantially the same manner that the sample in example exhibits resistance change, by applying the negative voltage pulse (voltage E1: −1.3V, pulse width 100 nsec) and the positive voltage pulse (voltage E2: +1.5V, pulse width 100 nsec) alternately. As can be seen from FIG. 8(b), the sample subjected to thermal treatment at 450 degrees C. does not exhibit any resistance change even though the negative voltage pulse (voltage E1: −1.3V, pulse width 100 nsec) and the positive voltage pulse (voltage E2: +1.5V, pulse width 100 nsec) are applied.

This may be possibly because the minute hillocks 108 penetrate the second tantalum oxide layer 105 and directly contact the first tantalum oxide layer as shown in the TEM image (FIG. 16(c)) of the sample heated at 450 degrees C., and therefore it is essential that the second tantalum oxide layer be present between the second electrode layer 107 and the first tantalum oxide layer to enable the resistance changing phenomenon to occur. From this, it should be understood that the height of the minute hillocks 108 must be smaller than the thickness of the second tantalum oxide layer 105 to enable the resistance variable layer 106 to change its resistance. It is presumed that the resistance variable layer 106 including the first tantalum oxide layer 104 and the second tantalum oxide layer 105 having a composition close to $Ta_2O_5$ is operative as a memory.

As described above, in this example, the forming process is implemented using a smaller forming voltage. After the forming process, reversible resistance changing is observed.

Hereinafter, a result of a more thorough research of the resistance variable layer 106 in example will be described.

[Analysis of Resistance Variable Layer]

A result of the analysis of the structure of the resistance variable layer 106 in this embodiment will be described. A prepared sample was manufactured by depositing tantalum oxide on a monocrystal silicon substrate provided with an oxide layer with a thickness of 200 nm and by emitting oxygen plasma to the tantalum oxide under the same condition that the sample of example was manufactured. Since Pt corresponding to the second electrode layer 107 was not deposited on the sample, the resistance variable layer was exposed.

Figure 9:
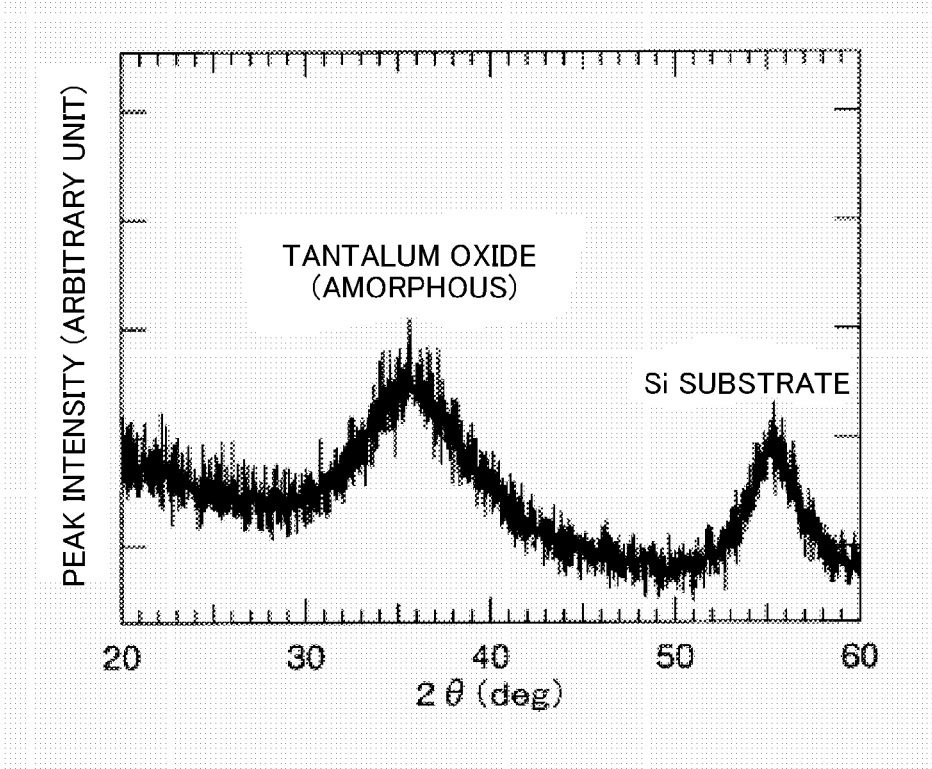
FIG. 9 is a view showing XRD (X-ray diffraction) spectra of a resistance variable layer comprising tantalum oxide according to Embodiment 1 of the present invention.

FIG. 9 is a graph showing X-ray diffraction spectra of the sample. With reference to FIG. 9, a peak was observed when 2θ was about 36 deg. From this, it can be seen that tantalum oxide was formed in the sample. Since this peak was broad and appeared in a range from 30~40 deg., crystal was assumed to have an amorphous state. A peak appearing when 2θ was about 56 deg. was attributed to the silicon substrate. Thus, it was found out that the sample included a resistance variable layer comprising amorphous tantalum oxide as a major component.

The resistance variable layer in the above sample was very thin (thickness 30 nm) and was amorphous as described above. For this reason, it was difficult to analyze these tantalum oxides accurately using normal X-ray diffraction spectra. Accordingly, more accurate analysis was conducted using a method called X-ray reflectometry. In this method, X-ray is caused to enter the surface of the sample at a small angle, and intensity of the reflected X-ray is measured. Fitting is performed assuming a proper structure model with respect to the spectra, and the thickness and refractive index of the resistance variable layer in the sample is evaluated. In the present case, parameters of the fitting are thicknesses and δ (=1−refractive index) of the respective layers of the stacked layer structure of the resistance variable layer.

Figure 10:
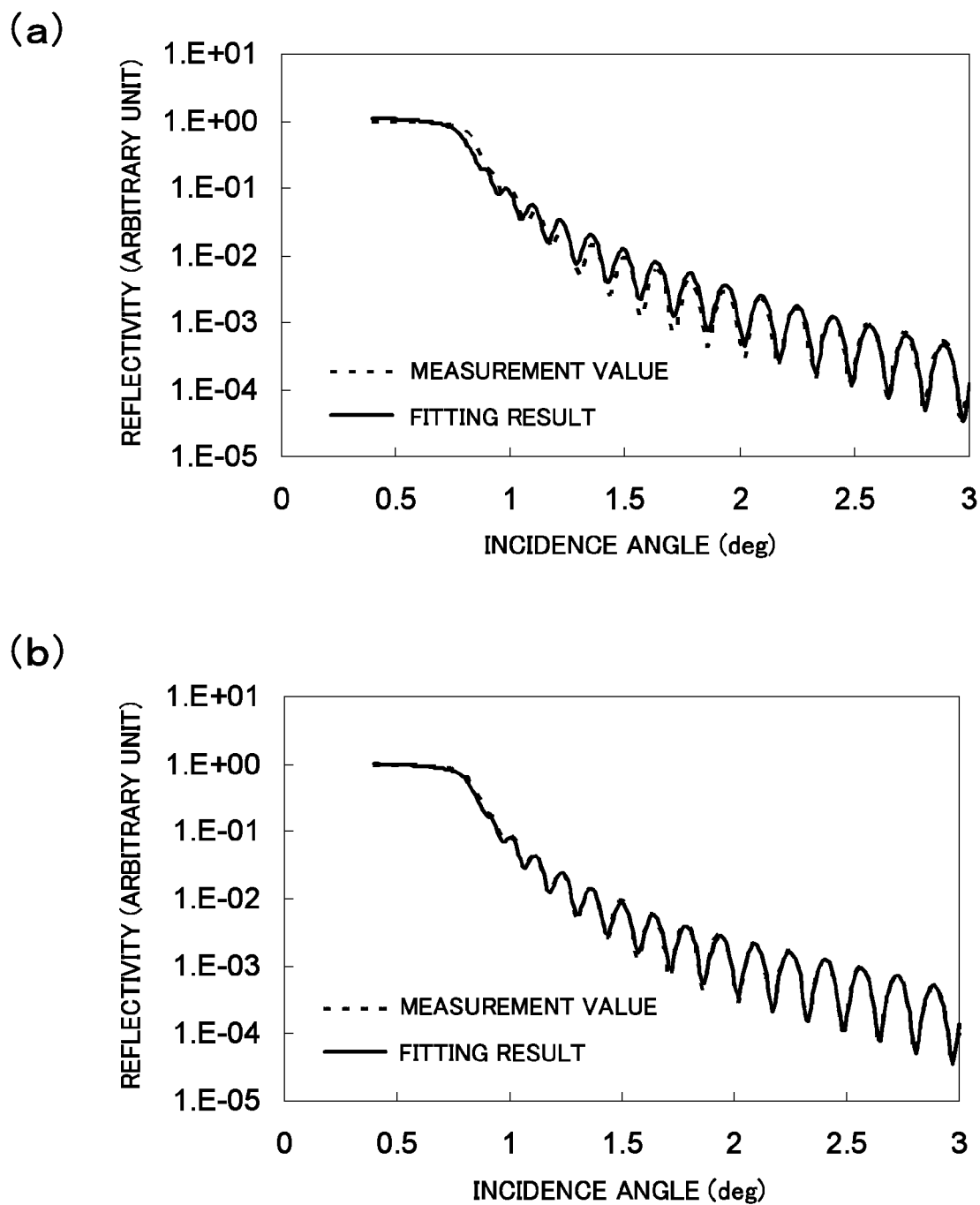
FIG. 10 is a view showing analysis result of X-ray reflectivity data of a resistance variable layer comprising tantalum oxide according to Embodiment 1 of the present invention.

FIG. 10 shows an example of X-ray reflectivity measurement pattern of the sample. In FIG. 10, a horizontal axis indicates an incidence angle of X-ray and a vertical axis indicates the reflectivity of the X-ray. FIG. 10(a) indicates a pattern (broken line) obtained by actual measurement of the X-ray reflectivity of a sample A and a result (solid line) of fitting performed assuming that a single-layer tantalum oxide layer is present on the substrate. FIG. 10(b) indicates a pattern (broken line) obtained by actual measurement of the X-ray reflectivity of the sample A and a result (solid line) of fitting performed assuming that a double-layer tantalum oxide layer is present on the substrate.

As can be seen from FIG. 10(a), the measurement values substantially conformed to the filling result values, but there was a slight difference between them. In contrast, as shown in FIG. 10(b), the reflectivity pattern of actual measurement conformed very closely to the reflectivity pattern obtained by fitting and were unable to be distinguished from each other. From the above results, it may be presumed that the sample was composed of different tantalum oxide layers which are the first and second tantalum oxide layers.

The analysis result obtained by conducting fitting assuming the double-layer stacked layer structure was such that the thickness of the first tantalum oxide layer was 22 nm and δ of the first tantalum oxide layer was $29 \times 10^{-6}$, while the thickness of the second tantalum oxide layer was about 8 nm, and δ of the second tantalum oxide layer was $23 \times 10^{-6}$. In general, δ of metal tantalum is $39 \times 10^{-6}$ and δ of $Ta_2O_5$ is $22 \times 10^{-6}$. When these values are compared to the values obtained in the present case, the first tantalum oxide layer is assumed as an incomplete oxide of Ta which is close to $TaO_{1.4}$. The composition of the second tantalum oxide layer is $TaO_{2.4}$ from the value of δ and is considered to be an oxide close to $Ta_2O_5$ ($TaO_{2.5}$).

The fact that the second tantalum oxide layer has a composition close to $Ta_2O_5$ is consistent with the fact that the initial resistance of the resistance variable element 100 of example is very high as compared to the sample including the first tantalum oxide layer composed of a single layer, as described with reference to FIG. 15. It may be presumed that in example, since the second tantalum oxide layer 105 having a composition close to $Ta_2O_5$ with a very high resistance is present between the first tantalum oxide layer 104 and the second electrode layer 107, the initial resistance of the resistance variable element 100 has a higher value than the resistance in a case where the first tantalum oxide layer 104 is composed of a single layer.

The resistivity of the first tantalum oxide layer having a composition close to $TaO_{1.4}$ is about 6 mΩ·cm according to a measurement result of a four-terminal method. The initial resistance of the resistance variable element 100 including the single-layer first tantalum oxide layer 104 is about 7Ω from calculation.

[Modification]

Figure 11:
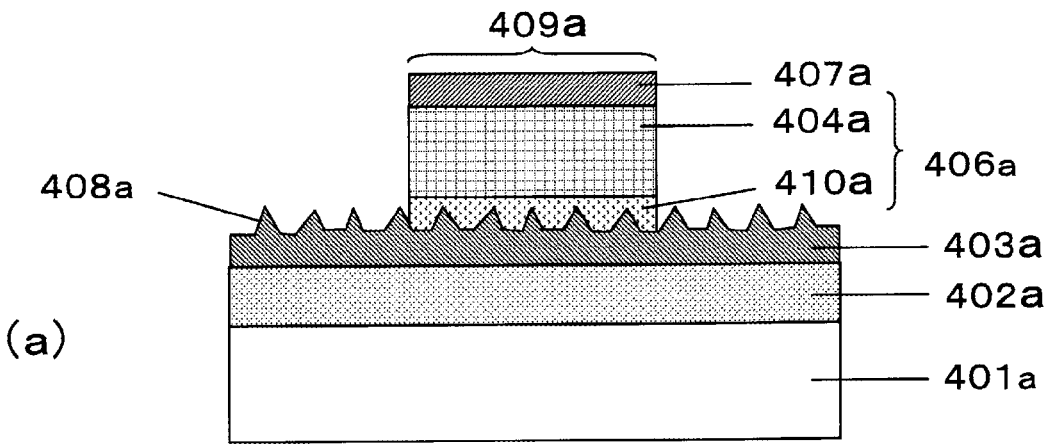
Figure 11:
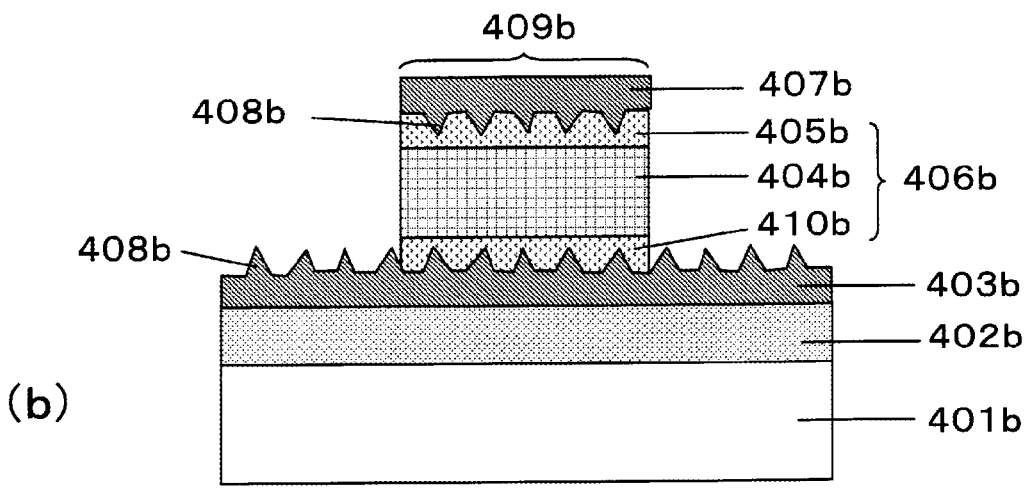

The element may have a structure formed by reversing the vertical relationship of the structure of FIG. 1. FIG. 11(a) is a cross-sectional view showing an exemplary schematic configuration of the resistance variable element according to the first modification of the present invention. A resistance variable element 400a of this modification includes on a substrate 401a, an oxide layer 402a, a first electrode layer 403a comprising a Pt layer, and a resistance variable layer 406a consisting of a second oxygen-deficient transition metal oxide layer 410a with higher oxygen content, and a first oxygen-deficient transition metal oxide layer 404a with lower oxygen content, and a second electrode layer 407a, which are stacked together in this order.

In this modification, the second oxygen-deficient transition metal oxide layer cannot be formed by a method of oxidating the first oxygen-deficient tantalum oxide layer. For this reason, it is necessary to control the oxygen content during, for example, deposition by a process such as sputtering.

An oxygen-deficient transition metal oxide layer with higher oxygen content and a Pt layer may be provided on upper and lower sides of a resistance variable layer. FIG. 11(b) is a cross-sectional view showing an exemplary schematic configuration of a resistance variable element according to the second modification of the present invention. A resistance variable element 400b of this modification includes an oxide layer 402b, a first electrode layer 403b comprising a Pt layer, a resistance variable layer 406b consisting of a lower second oxygen-deficient transition metal oxide layer 410b, a first oxygen-deficient transition metal oxide layer 404b, and an upper second oxygen-deficient transition metal oxide layer 405b, and a second electrode layer 407b comprising a Pt layer, which are stacked together in this order on a substrate 401b. It should be noted that in this case, a resistance changing operation occurs at an upper interface (interface between the upper second oxygen-deficient transition metal oxide layer 405b and the second electrode layer 407b) and a lower interface (interface between the lower second oxygen-deficient transition metal oxide layer 410b and the first electrode layer 403b). In addition, it is confirmed that the resistance variable element of FIG. 14 stably performs a resistance changing operation if its resistance variable material is oxygen-deficient hafnium oxide or oxygen-deficient zirconium oxide. Therefore, even when other transition metal oxides are used as the resistance variable material, the forming voltage is effectively decreased because of the presence of the hillocks.

As the material of the second electrode layer 107, Pd (palladium) may be used. When Pd is used as the electrode material of the second electrode layer, the other constituents of the resistance variable element may be configured to be identical to those of the resistance variable element including the second electrode layer comprising Pt as the electrode material. In a manufacturing method of the resistance variable element including the second electrode layer comprising Pd as the electrode material, a Pd thin layer as the second electrode layer 107 is deposited by sputtering on the second transition metal oxide layer 105, instead of forming the Pt thin layer, in the above described manufacturing method of the resistance variable element 100. The layer deposition conditions in this case are similar to those used in deposition of the first electrode layer 103. The other steps are similar to those in the above described manufacturing method of the resistance variable element 100, and will not be described repetitively. Alternatively, other material may be added to the electrode material Pd of the second electrode layer so long as similar hillocks protruding toward the resistance variable layer can be formed. Also, it is presumed that material (alloy material substantially having a property of Pd) comprising Pd as a major component allows similar hillocks to be produced.

Figure 18:
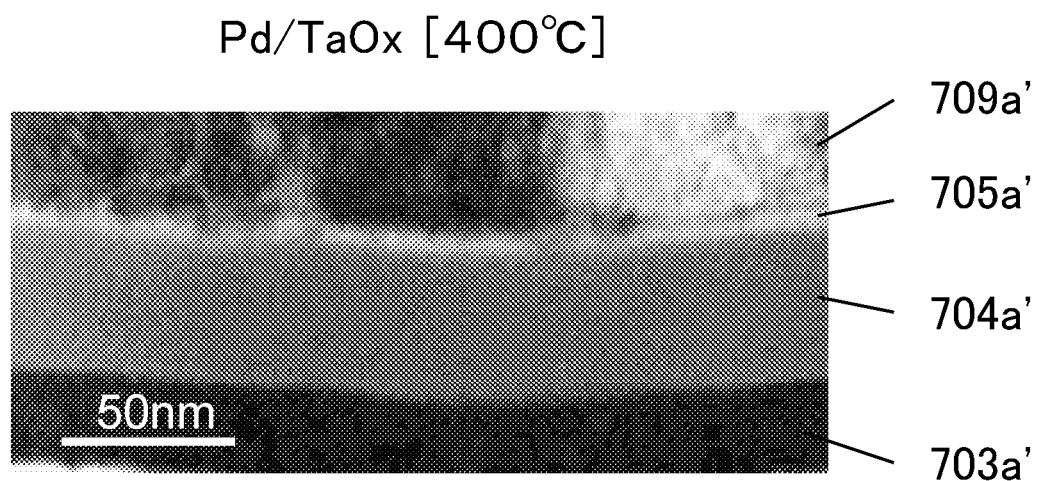
FIG. 18 is a transmission electron microscope (TEM) photograph showing a cross-section of a resistance variable element according to a modification including an upper electrode layer comprising Pd.

An element of FIG. 18 was obtained by stacking a first oxygen-deficient Ta oxide layer 704a' with a thickness of about 43 nm, a second oxygen-deficient Ta oxide layer 705a' with a thickness of about 7 nm, and an upper electrode layer 709a' comprising a Pd layer with a thickness of about 50 nm, together, in this order, on a lower electrode layer 703a comprising TaN. The oxygen content of the first oxygen-deficient Ta oxide layer 704a' was set higher than the oxygen content of the second oxygen-deficient Ta oxide layer 705a'. The element of FIG. 18 was manufactured using a process technique for manufacturing a semiconductor device. The maximum temperature in the heating step of the process steps was set to about 400 degrees C. The heating time was set to about 10 minutes.

As can be seen from FIG. 18, when Pd is used as the electrode material of the second electrode layer, the upper electrode layer 709a' has minute hillocks produced toward the second oxygen-deficient Ta oxide layer 705a' at the interface between the upper electrode layer 709a' and the second oxygen-deficient Ta oxide layer 705a'.

The method of forming the locally thinned portions in the second oxygen-deficient transition metal oxide layer is not limited to heating. Various methods which are obvious to those skilled in the art, for example, a method using stress migration or a method using heating and stress migration, may be used, so long as the "locally thinned portions" can be formed to effectively decrease the voltages of the electric pulses required for the forming process.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A resistance variable element of the present invention allows a forming process to be easily performed, is capable of a high-speed operation, has a stable rewrite characteristic, and is useful as a resistance variable element and the like for use with a variety of electronic hardware such as digital home appliance, memory cards, cellular phones, and personal computers.

DESCRIPTION OF REFERENCE NUMERALS 100 resistance variable element
101 substrate
102 oxide layer
103 first electrode layer
104 first transition metal oxide layer
105 second transition metal oxide layer
106 resistance variable layer
107 second electrode layer
108 hillocks
109 element region
200 resistance variable element for experiment
201 substrate
202 oxide layer
203 first electrode layer
204 first tantalum oxide layer
205 second tantalum oxide layer
206 resistance variable layer
207 second electrode layer
209 element region
400a, b resistance variable element
401a, b substrate
402a, b oxide layer
403a, b first electrode layer
404a, b first transition metal oxide layer
405b, 410a, b second transition metal oxide layer
406a, b resistance variable layer
407a, b second electrode layer
408a, b hillocks
409a, b element region 703a, b, c, d first electrode layer
704a, b first transition metal oxide layer
705a, b second transition metal oxide layer
706c, d resistance variable layer
709a, b, c, d second electrode layer

The invention claimed is:

1. A resistance variable element comprising:
a first electrode;
a second electrode; and
a resistance variable layer which is interposed between the first electrode and the second electrode to contact the first electrode and the second electrode, the resistance variable layer being configured to reversibly change resistivity in response to electric signals with different polarities which are applied between the first electrode and the second electrode, wherein:
the resistance variable layer includes a stacked layer structure including a first oxygen-deficient transition metal oxide layer and a second oxygen-deficient transition metal oxide layer with higher oxygen content than the first oxygen-deficient transition metal oxide layer,
the second oxygen-deficient transition metal oxide layer is in contact with the second electrode,
a material of the second electrode has crystal grains having grain boundaries,
the material of the second electrode has protrusions at an interface between the second oxygen-deficient transition metal oxide layer and the second electrode, the protrusions protruding from the grain boundaries, and
the second oxygen-deficient transition metal oxide layer has locally thinned portions at concave portions corresponding to the protrusions.

2. The resistance variable element according to claim 1, wherein an interface between the first oxygen-deficient transition metal oxide layer and the second oxygen-deficient transition metal oxide layer is flat.

3. The resistance variable element according to claim 1, wherein the second electrode comprises platinum or platinum alloy.

4. The resistance variable element according to claim 3, wherein the locally thinned portions have a thickness which is not less than 0.1 nm and not more than 5 nm.

5. The resistance variable element according to any one of claims 1, 2, 3 and 4, wherein the transition metal oxide layer is a tantalum oxide layer.

6. The resistance variable element according to claim 1, wherein the protrusions have a V-shape cross section.

7. The resistance variable element according to claim 1, wherein the protrusions are randomly formed.

* * * * *